United States Patent
Hille et al.

(10) Patent No.: US 10,276,656 B2
(45) Date of Patent: Apr. 30, 2019

(54) METHOD OF MANUFACTURING SEMICONDUCTOR DEVICES BY USING EPITAXY AND SEMICONDUCTOR DEVICES WITH A LATERAL STRUCTURE

(71) Applicant: Infineon Technologies AG, Neubiberg (DE)

(72) Inventors: Frank Hille, Munich (DE); Andre Brockmeier, Villach (AT); Francisco Javier Santos Rodriguez, Villach (AT); Daniel Schloegl, Villach (AT); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/885,340

(22) Filed: Jan. 31, 2018

(65) Prior Publication Data

US 2018/0226471 A1    Aug. 9, 2018

(30) Foreign Application Priority Data

Feb. 3, 2017    (DE) ........................ 10 2017 102 127

(51) Int. Cl.
*H01L 23/58*    (2006.01)
*H01L 29/06*    (2006.01)
(Continued)

(52) U.S. Cl.
CPC ...... *H01L 29/0638* (2013.01); *H01L 21/0243* (2013.01); *H01L 21/02378* (2013.01);
(Continued)

(58) Field of Classification Search
CPC ............. H01L 29/7811; H01L 29/0638; H01L 21/76898; H01L 29/78; H01L 21/02203
(Continued)

(56) References Cited

U.S. PATENT DOCUMENTS 5,273,929 A    12/1993    Hirtz et al.
5,837,607 A *  11/1998    Quick ................... C23C 16/047
                                                              438/667
(Continued)

FOREIGN PATENT DOCUMENTS

EP            2950339 A1    12/2015

OTHER PUBLICATIONS

Brockmeier, A., et al., "Surface tension and its role for vertical wet etching of silicon," IOP Publishing, J. Micromech. Microeng., 22, 125012, doi:10.1088/0960-1317/22/12/125012, Nov. 6, 2012, 7 pages.

(Continued)

*Primary Examiner* — Theresa T Doan
(74) *Attorney, Agent, or Firm* — Slater Matsil, LLP

(57) ABSTRACT

Epitaxy troughs are formed in a semiconductor substrate, wherein a matrix section of the semiconductor substrate laterally separates the epitaxy troughs and comprises a first semiconductor material. Crystalline epitaxy regions of a second semiconductor material are formed in the epitaxy troughs, wherein the second semiconductor material differs from the first semiconductor material in at least one of porosity, impurity content or defect density. From the epitaxy regions at least main body portions of semiconductor bodies of the semiconductor devices are formed.

18 Claims, 37 Drawing Sheets

(51) Int. Cl.
  *H01L 21/02* (2006.01)
  *H01L 21/306* (2006.01)
  *H01L 21/225* (2006.01)
  *H01L 21/78* (2006.01)

(52) U.S. Cl.
  CPC .. *H01L 21/02381* (2013.01); *H01L 21/02634* (2013.01); *H01L 21/02658* (2013.01); *H01L 21/2252* (2013.01); *H01L 21/30608* (2013.01); *H01L 21/78* (2013.01); *H01L 21/7806* (2013.01)

(58) Field of Classification Search
  USPC ...................................................... 257/652
  See application file for complete search history.

(56) References Cited

U.S. PATENT DOCUMENTS

| | | |
|---|---|---|
| 6,677,183 B2 | 1/2004 | Sakaguchi et al. |
| 2008/0017896 A1 | 1/2008 | Quick et al. |
| 2012/0252164 A1 | 10/2012 | Nakao et al. |
| 2013/0207226 A1 | 8/2013 | Adam et al. |

OTHER PUBLICATIONS

Pal, Prem et al., "A comprehensive review on convex and concave corners in silicon bulk micromachining based on anisotropic wet chemical etching," Pal and Sato Micro and Nano Systems Letters, a SpringerOpen Journal, 3:6, May 27, 2015, 42 pages.

\* cited by examiner

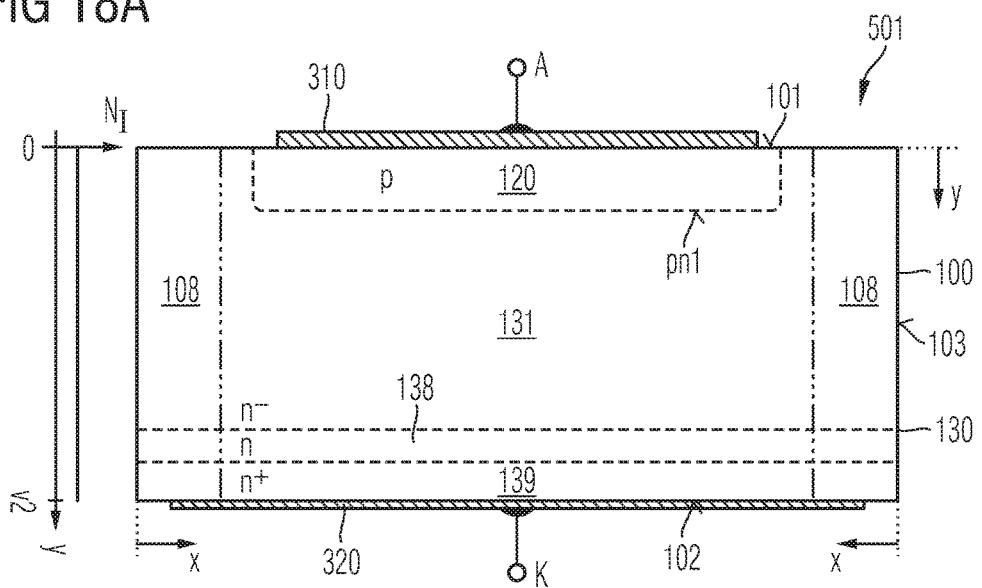
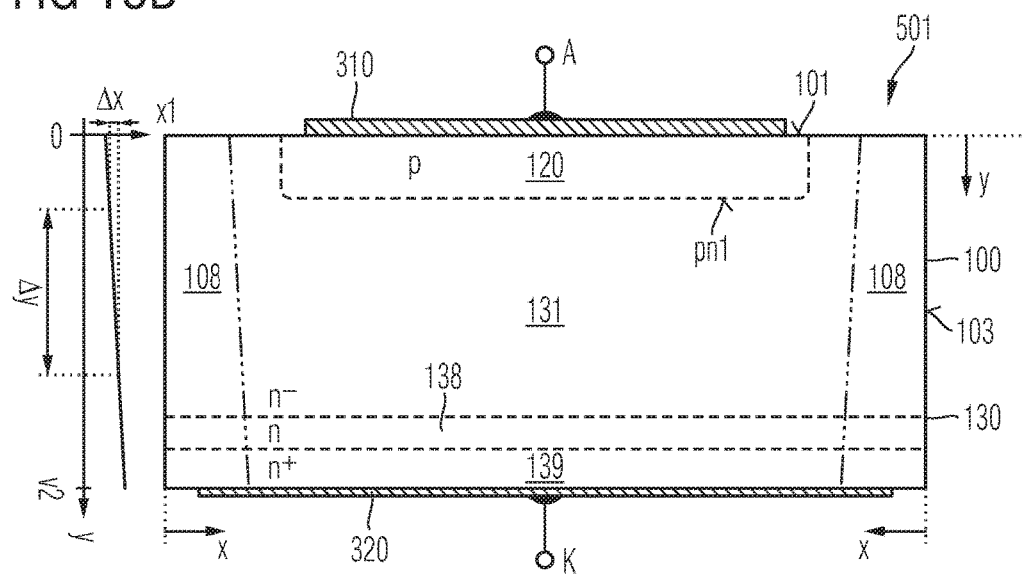

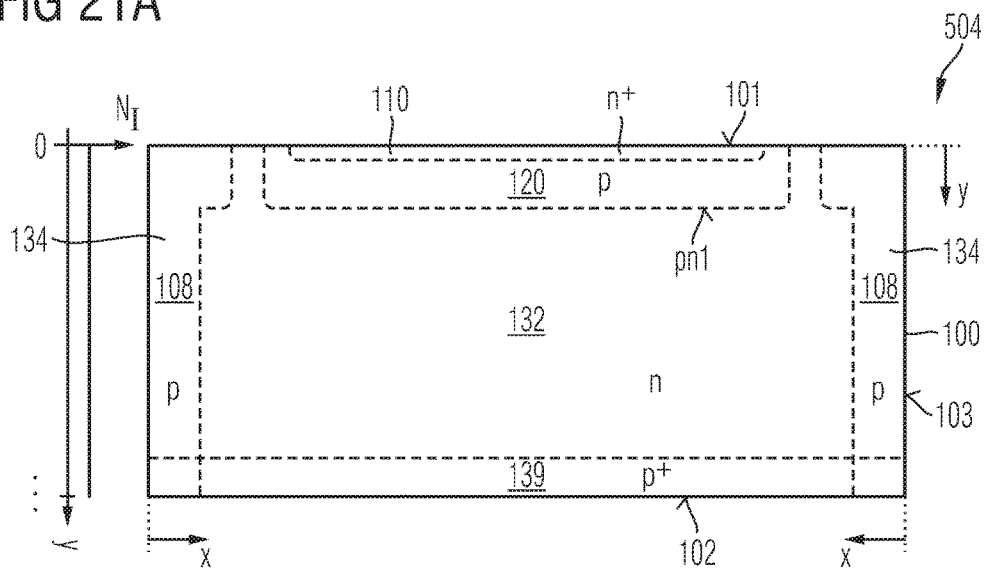
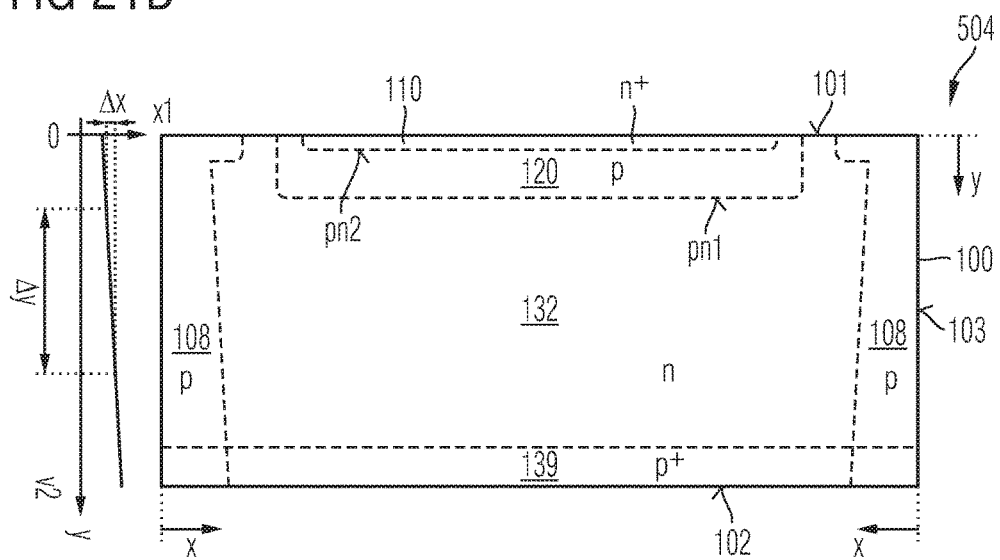

METHOD OF MANUFACTURING SEMICONDUCTOR DEVICES BY USING EPITAXY AND SEMICONDUCTOR DEVICES WITH A LATERAL STRUCTURE

This application claims the benefit of German Application No. 102017102127.2, filed on Feb. 3, 2017, which application is hereby incorporated herein by reference in its entirety.

BACKGROUND

Forming semiconductor devices, e.g., power semiconductor devices including power semiconductor diodes, IGFETs (insulated gate field effect transistors) and IGBTs (insulated gate bipolar transistors) includes formation of semiconducting elements in a semiconductor wafer and then separating single semiconductor dies of semiconductor devices from the wafer by a separation process, e.g., dicing, etching, sawing or breaking. The separation process may adversely affect a semiconductor crystal lattice along lateral surfaces of the semiconductor dies exposed by the separation process. Edge structures such as chipping stoppers, glass frames and passivation layers typically protect the semiconductor dies against chipping, against crystal damage spreading from the lateral surface, e.g., cleavage planes expanding in high temperature treatments, and against impurities entering the semiconductor body through the lateral surfaces. In addition or alternatively, termination structures including conductive, dielectric and/or semiconducting regions in a termination region of the semiconductor die aim at keeping the lateral surface free from electric fields such that lattice defects and impurities existent along the lateral surface have no or only low impact on the device characteristics.

It is desirable to reduce the impact of dicing and edge effects on the electric characteristics of semiconductor devices at low effort.

SUMMARY

The present disclosure concerning a method of manufacturing semiconductor devices includes forming epitaxy troughs in a semiconductor substrate, wherein a matrix section of the semiconductor substrate laterally separates the epitaxy troughs. The matrix section includes a first semiconductor material. Crystalline epitaxy regions of a second semiconductor material are formed in the epitaxy troughs, wherein the second semiconductor material differs from the first semiconductor material in at least one of porosity and impurity content and defect density. From the epitaxy regions at least main body portions of semiconductor bodies of the semiconductor devices are formed.

The present disclosure further concerns a semiconductor device including a doped main structure in a semiconductor body. The doped main structure forms a first pn junction with an anode/body well at a front side defined by a first surface of the semiconductor body. The doped main structure further includes a doped electrode layer directly adjoining a second surface opposite to the first surface. A lateral structure directly adjoins the main structure and a lateral surface, which connects the first and second surfaces. In at least a portion of the lateral structure a concentration of at least one impurity decreases with increasing distance to the lateral surface. A distance between the lateral surface and a surface of equal concentration of the at least one impurity is uniform or increases with increasing distance to the first surface by not more than 20 micrometer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of the present disclosure and together with the description serve to explain principles of the embodiments. Further embodiments and intended advantages will be readily appreciated as they become better understood by reference to the following detailed description.

FIG. 18A is a schematic vertical cross-sectional view of a power semiconductor diode according to an embodiment with a lateral structure of uniform width and containing non-doping impurities;

FIG. 18B is a schematic vertical cross-sectional view of a power semiconductor diode according to another embodiment with a lateral structure with a width increasing with increasing distance to the front side and containing non-doping impurities;

FIG. 21A is a schematic vertical cross-sectional view of a thyristor according to an embodiment with a lateral structure of uniform width and containing dopants; and FIG. 21B is a schematic vertical cross-sectional view of a thyristor according to another embodiment with a lateral structure with a width increasing with increasing distance to the front side and containing dopants.

DETAILED DESCRIPTION OF ILLUSTRATIVE EMBODIMENTS

Figure 1A:
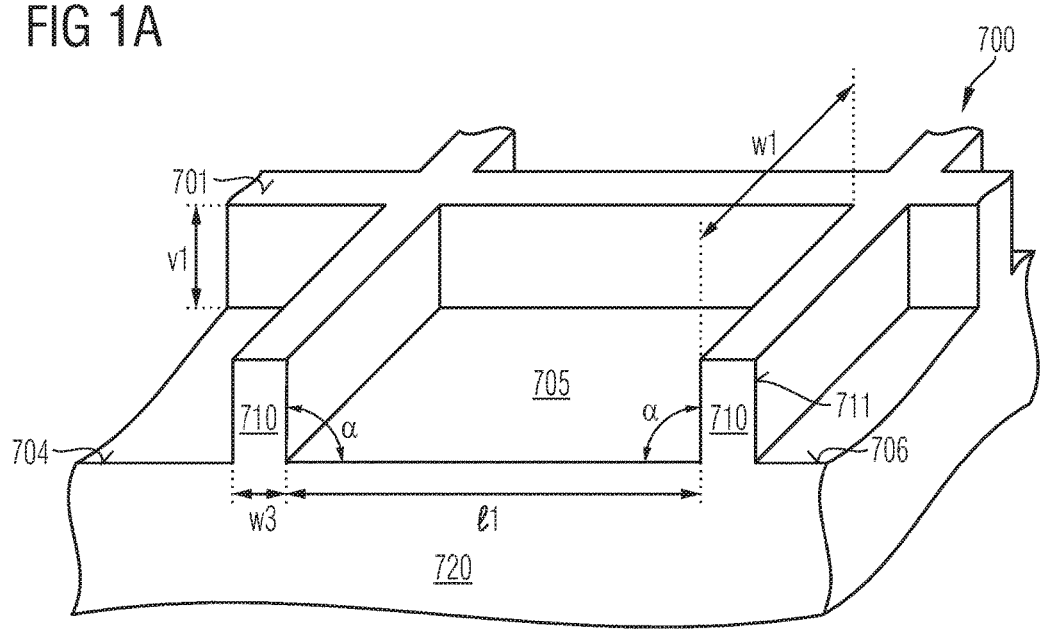
FIG. 1A is a schematic perspective view of a portion of semiconductor substrate for illustrating a method of manufacturing semiconductor devices by forming semiconductor bodies of the semiconductor devices in epitaxy troughs of the semiconductor substrate according to an embodiment, after forming the epitaxy troughs.

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosures includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example, a direct contact between the concerned elements or a low-ohmic connection through a metal and/or a heavily doped semiconductor. The term "electrically coupled" includes that one or more intervening element(s) adapted for signal transmission may be provided between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D illustrate the formation of complete semiconductor bodies or at least of main portions of the semiconductor bodies of semiconductor devices in epitaxy troughs 705, which are cavities formed in a process surface 701 of a flat semiconductor substrate 700. Directions parallel to the process surface 701 are horizontal directions. A normal to the process surface 701 defines the vertical direction.

The semiconductor substrate 700 may be a slice obtained, e.g., by sawing, from a single-crystalline ingot. For example, the semiconductor substrate 700 is a semiconductor wafer from a crystalline material such as silicon (Si), germanium (Ge), silicon germanium (SiGe), silicon carbide (SiC) or an AIIIBV semiconductor. The semiconductor substrate 700 may have a diameter of 150 mm, 200 mm, 300 mm or 450 mm and a thickness in a range from 400 µm to 800 µm. According to an embodiment, the semiconductor substrate 700 is an Fz:Si (floating zone silicon) wafer obtained from a crystal rod drawn from a melting zone of a rod from a non-single-crystalline source material, a Cz:Si (Czochralski silicon) wafer obtained by sawing a single crystalline ingot drawn from a melt in a melting pot in a Czochralski process or an m-Cz:Si (MCZ) wafer obtained by a Czochralski process supported by a magnetic field or a silicon carbide wafer. Typically, the various processes for forming crystalline silicon show characteristic impurity signatures. For example, Cz:Si wafers contain more oxygen and carbon than Fz:Si wafers.

By using a mask patterned by photolithography, epitaxy troughs 705 are formed that extend from the process surface 701 at a front side of the semiconductor substrate 700 into the semiconductor substrate 700, wherein the epitaxy troughs 705 are cavities that have two orthogonal horizontal dimensions within the same order of magnitude.

Forming the epitaxy troughs 705 may include a main etching process and one or more auxiliary processes. The main etching process may be a dry etching, for example, a Bosch process or a TCP (Transformer Coupling Plasma) process, or a wet etching process, e.g., an isotropic or anisotropic etching. For example, an anisotropic wet etching uses a solution including alkaline ions, such as aqueous sodium hydroxide (NaOH) or aqueous potassium hydroxide (KOH) solutions, which may include further additives.

Forming the epitaxy troughs 705 may also include auxiliary processes for smoothening the surface of sidewalls of the epitaxy troughs 705 after the main etch. The auxiliary processes may include a heating treatment in an atmosphere containing hydrogen (H2) or ammonia (NH$_3$) to re-arrange the semiconductor atoms exposed at the sidewalls along main crystal planes or a heating treatment in an oxygen containing atmosphere to grow a sacrificial oxide that is removed in an auxiliary etch.

FIG. 1A shows a plurality of epitaxy troughs 705 extending from the process surface 701 into the semiconductor substrate 700. Ribs of un-etched semiconductor substrate 700 between the epitaxy troughs 705 form a matrix section 710 separating the epitaxy troughs 705 from each other in horizontal directions parallel to the process surface 701. An unpatterned, continuous base section 720 of the semiconductor substrate 700 extends from a bottom 706 of the epitaxy troughs 705 to a support surface on the back of the semiconductor substrate 700, wherein the support surface is parallel to the process surface 701.

The matrix section 710 may form a regular, orthogonal grid with rectangular epitaxy troughs 705 arranged in lines and columns. According to other embodiments, neighboring lines of epitaxy troughs 705 may be shifted to each other.

A horizontal cross-sectional area of the epitaxy troughs 705 parallel to the process surface 701 may be in a range from 0.2 mm$^2$ to 4 cm$^2$, for example, in a range from 0.5 mm$^2$ to 4 cm$^2$ or for example, in a range from 0.8 mm$^2$ to 2 cm$^2$. A trough length l1 in the horizontal plane may be in a range from 0.5 mm to 2 cm and a trough width w1 in the horizontal plane and orthogonal to the trough length l1 may be in a range from 0.5 mm to 2 cm. A trough depth v1 in a vertical direction orthogonal to the process surface 701 may be in a range from 5 µm to 200 µm, for example in a range from 40 µm to 140 µm.

A rib width w3 of the ribs of the matrix section 710 may be the same for first ribs extending parallel to the trough length l1 and for second ribs extending parallel to the trough width w1. The rib width w3 is in a range from 30 µm to 500 µm, for example in a range from 50 µm to 200 µm.

Rib sidewalls 711 of the matrix section 710 may be completely vertical. After anisotropic wet etching the rib sidewalls 711 may have a slope angle $\alpha \geq 90°$ such that the epitaxy troughs 705 taper with increasing distance to the process surface 701, wherein the slope angle $\alpha$ may be smaller than 95°, e.g., smaller than 92°. A Bosch process may result in a slope angle $\alpha < 90°$, wherein the slope angle $\alpha$ may be $\alpha > 85°$, e.g., $\alpha > 88°$.

According to another embodiment, a first section of the rib sidewalls 711 directly adjoining the process surface 701 may be vertical and a second section directly adjoining the bottom 706 of the epitaxy troughs 705 may have a slope angle $\alpha > 90°$ such that the edges of the epitaxy troughs 705 along the bottom 706 are chamfered.

A crystalline first semiconductor material forms the complete matrix section 710 or at least rib sidewall sections extending along the rib sidewalls 711 from the process surface 701 to the bottom 706 of the epitaxy troughs 705. The first semiconductor material is defined by the atoms forming the crystal lattice, by type and concentration of impurities at crystal lattice sites, by type and concentration of interstitial impurities, and by the degree of porosity of the crystal lattice. The atoms forming the crystal may include silicon, silicon carbide and/or germanium atoms. The impurities at lattice sites may be typical dopant atoms such as boron, gallium, aluminum, arsenic, phosphorus, selenium, and/or sulfur atoms. Other impurities like oxygen, nitrogen, carbon and/or heavy metal atoms may be substitutional, interstitial, or both. The porosity is defined by the fraction of the total volume of voids in the crystal lattice over the total volume of the crystal lattice and has a value between 0% and 95%.

The first semiconductor material maybe the starting material of the semiconductor substrate 700. For example, the first semiconductor material is Cz:Si with the typical impurity signature of Cz:Si or MCZ material and a porosity of less than 0.1%. According to other embodiments the first semiconductor material is defined by a pretreatment of the starting material before or after the formation of the epitaxy troughs 705. For example, impurities may be diffused or implanted into at least rib sidewall sections along the rib sidewalls 711 after formation of the epitaxy troughs 705.

Epitaxy regions 760 of a crystalline second semiconductor material are formed in the epitaxy troughs 705 of FIG. 1A, wherein the crystal lattice of the base material of the second semiconductor material matches with the crystal lattice of the base section 720 and the base material of the first semiconductor material such that the crystalline second semiconductor material grows in registry with the crystalline base section 720 and with the first semiconductor material.

For example, an epitaxy process provides atoms of the second semiconductor material that deposit on the bottom 706 and on the rib sidewalls 711, wherein the atoms of the second semiconductor material resume and continue the crystal lattice of the base section 720. The deposited second semiconductor material may be uniformly doped, e.g., lightly n-doped, may have a doping gradient along the vertical direction or may have a layered structure with horizontal layers of different mean dopant concentration.

Deposition of the second semiconductor material on top of the ribs of the matrix section 710 may be suppressed by an epitaxy mask, which may be formed from an etch mask defining the epitaxy troughs 705 of FIG. 1A. Forming the epitaxy regions 760 may further include a polishing process that leaves planar surfaces 761 at the front side of the epitaxy regions 760 and that may stop at or close to the top of the epitaxy mask, between the top of the ribs of the matrix section 710 and the top of the epitaxy mask, on top of the matrix section 710 or below the epitaxy mask.

Figure 1B:
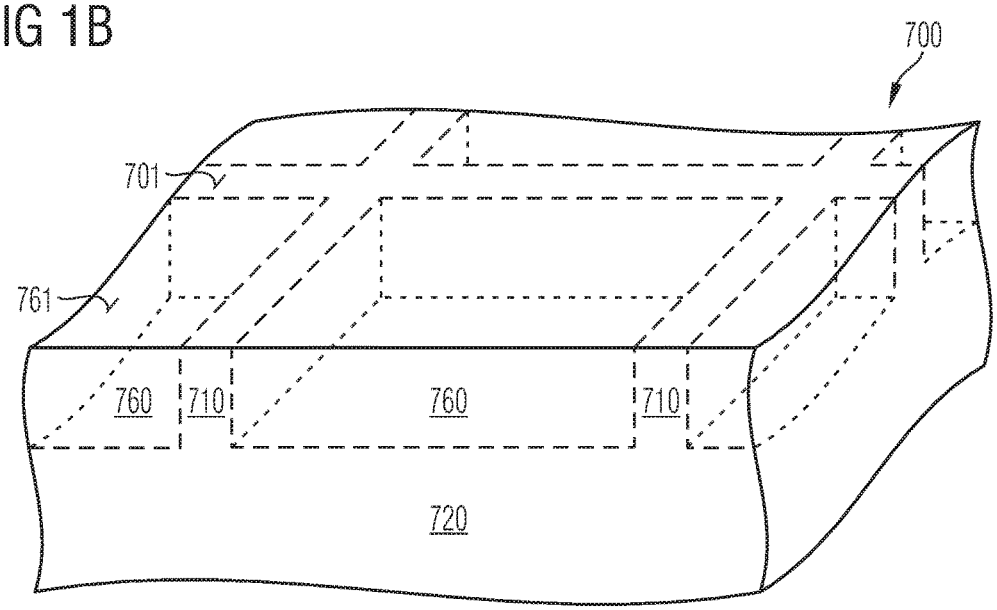
FIG. 1B is a schematic perspective view of the semiconductor substrate portion of FIG. 1A, after forming epitaxy regions in the epitaxy troughs.

In FIG. 1B the epitaxy regions 760 completely fill the epitaxy troughs 705 of FIG. 1A.

The crystalline second semiconductor material forming the epitaxy regions 760 differs from the first semiconductor material, which forms at least sidewall sections of the matrix section 710, in at least one impurity that is contained in only one of the first and second semiconductor materials, and/or in a difference of a mean concentration of at least one impurity type contained in both the first and the second semiconductor materials by at least a factor of two, or even 5 or even 10 or even 100 or even 1000, or in a difference in porosity by at least 5%, e.g., at least 10% or at least 50%, for example, at least 90%. For the case of silicon carbide material the second material may differ in the density of defects such as basal plane dislocations, threading edge dislocations or stacking faults.

The first semiconductor material and the second semiconductor material have the same main constituent or the same main constituents. For example, both the first and the second semiconductor material contain silicon (Si) or Germanium (Ge) as only main constituent. According to another embodiment, both the first and the second semiconductor material contain silicon (Si) and carbon (C) as only main constituents, wherein the silicon and carbon atoms form a SiC crystal lattice, e.g., a hexagonal crystal lattice.

For example, the matrix section 710 and the epitaxy regions 760 contain dopants of the same type but in concentrations differing by at least one or two orders of magnitude. Alternatively or in addition, a mean concentration of certain impurities, such as oxygen, nitrogen, carbon or heavy metal atoms in the matrix section 710 may differ from the mean concentration of the same impurity in the epitaxy region 760 by at least one order of magnitude, for example, by two orders of magnitude. Alternatively or in addition, the porosity of the matrix section 710 or at least portions of the matrix section 710 may be significantly higher. For example, the porosity of the second semiconductor material is at most 0.1% and the porosity of the first semiconductor material is at least 5%, at least 20%, or at least 50%.

In each of the epitaxy regions 760 a complete semiconductor body 100 or at least a main portion of a semiconductor body 100 of a semiconductor device is formed. The processes applied for forming the semiconductor body 100 depend on the type of the target semiconductor device obtained from the semiconductor substrate 700. The semiconductor device may be a power semiconductor device, for example, a power semiconductor diode, a thyristor, an IGFET, e.g., a power MOSFET, or an IGBT, wherein IGFETs and IGBTs include a plurality of identical transistor cells electrically connected in parallel. The semiconductor device may further include an LV (low voltage) portion including interface logic and control circuits for short-circuit protection, by way of example. Formation of the semiconductor bodies 100 may include a sequence of deposition, etching, implant and patterning processes.

Figure 1C:
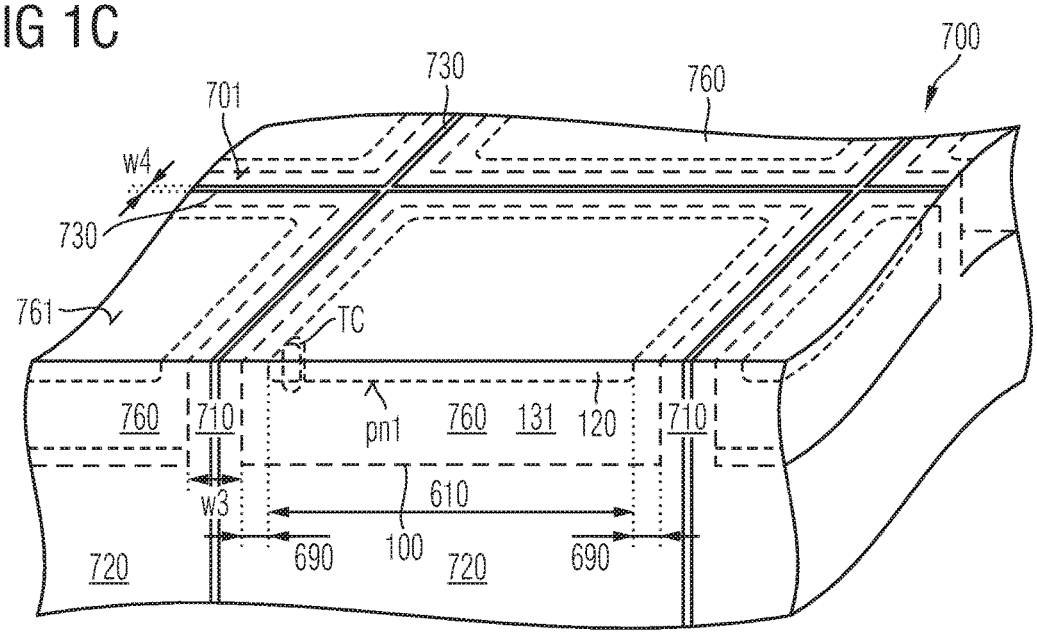
FIG. 1C is a schematic perspective view of the semiconductor substrate portion of FIG. 1B, after forming semiconductor bodies of semiconductor devices from the epitaxy regions.

FIG. 1C shows, by way of example, epitaxy regions 760 in which at least main portions of semiconductor bodies 100 of vertical power semiconductor devices are formed, wherein in vertical power semiconductor devices a load current flows from the front side to the rear side or vice versa. Each semiconductor body 100 includes an active region 610, which may contain the anode region of a semiconductor diode or the active transistor cells TC in an IGFET, power MOSFET or IGBT. An anode/body well 120 forms a first pn junction pn1 with a lightly doped drift zone 131 and may form the anode region of a semiconductor diode or the body regions of transistor cells TC. An edge region 690 laterally surrounds the active region 610, wherein the edge region 690 may contain a junction termination such as, e.g., field rings, field plates, and variation of lateral doping. The planar surface 761 of the epitaxy region 760 forms a first surface 101 at a front side of the semiconductor body 100.

Then the semiconductor bodies 100 are separated from the semiconductor substrate 700 by a dicing or separation process along dicing streets 730 running parallel to the ribs of the matrix section 710. In the dicing streets 730 the separation process, which may include sawing, cutting, etching or any combination thereof, consumes the material of the semiconductor substrate 700. A kerf width w4 of the dicing streets 730 may be narrower, equal to or wider than the rib width w3.

The separation process may include mechanically sawing through the ribs of the matrix section 710, cutting vertically through the ribs by using a laser beam, etching the complete ribs of the matrix section 710, or etching at least sidewall sections of the matrix section 710 directly adjoining to the semiconductor bodies 100. The etching process may make use of the different material characteristics of the first and second semiconductor materials. For example, a higher porosity of the second semiconductor material may be used to selectively remove the ribs of the matrix section 710 with respect to the semiconductor bodies 100 and/or for breaking the semiconductor substrate 700 along the porous ribs. The separation process may also include a removal of the base section 720 before or after forming the dicing streets 730, wherein a second surface 102 of the semiconductor bodies 100 is exposed. After removal of the base section 720 implant, deposition and patterning and laser annealing processes may be applied to the exposed second surface 102 to form a doped horizontal electrode/emitter layer 139, which may realize a backside emitter or a drain region.

Figure 1D:
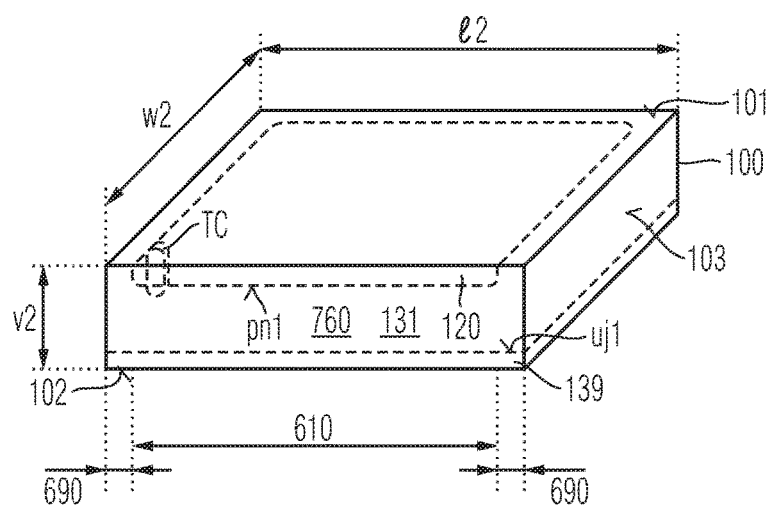
FIG. 1D is a schematic perspective view of a semiconductor body obtained by dicing from the semiconductor substrate portion of FIG. 1C.

FIG. 1D shows one of the semiconductor bodies 100 obtained by the separation process from the semiconductor substrate 700 of FIG. 1C. The doped electrode/emitter layer. 139, which may be a backside emitter or a drain region, may be formed along the second surface 102 after exposure of the second surface 102. A lateral surface 103 connects the first and second surfaces 101, 102. The semiconductor body 100 may include exclusively at least a part of the epitaxy region 760 of FIG. 1C or not more than the complete semiconductor body 100 or, in addition to the epitaxy region 760, an adjoining section of the base section 720, and/or adjoining sections of the ribs of the matrix section 710 of FIG. 1C as a portion of the edge region 690. A device length l2 may be equal to the trough length l1 of FIG. 1A or may exceed the trough length l1 by at most 50%, e.g., at most 10%. A device width w2 may be equal to the trough width w1 of FIG. 1A or may exceed the trough width w1 by at most 50%, e.g., at most 10%. A vertical extension v2 of the semiconductor body 100 may be equal to the trough depth v1 of FIG. 1A or exceeds the trough depth v1 by at most 50%.

The semiconductor substrate 700 may be a comparatively cost-effective substrate. For example, Cz:Si wafers are less expensive than Fz:Si wafers with the same diameter at the costs of a higher content of impurities such as oxygen, nitrogen and/or carbon. By contrast, the second semiconductor material is of comparatively high quality, e.g., has a significant lower content of impurities such as oxygen, nitrogen and/or carbon. The method therefore facilitates to decouple the quality of the semiconductor material of the semiconductor device from the quality of the semiconductor material of the substrate. Cz:Si wafers with a diameter of 200 mm, 300 mm or more can be used to manufacture semiconductor devices with a lower oxygen and carbon content than Cz:Si material in an effective way.

In addition, the difference in impurity content and/or porosity of the crystalline first and second semiconductor materials in the epitaxy region 760 and the matrix section 710 may be used to modify the edge region 690 along the complete vertical extension of the semiconductor body 100 without complex masking and without long diffusion processes at the front side and/or on the back. Alternatively or in addition, separation of the semiconductor bodies 100 from the semiconductor substrate 700 may be carried out at lower process complexity and with reduced impact on crystal quality of the semiconductor body 100.

FIGS. 2A to 2L refer to details of the process of FIGS. 1A to 1D according to an embodiment using an anisotropic wet etching process for forming epitaxy troughs in a semiconductor substrate.

A mask layer is deposited on the process surface 701 of a semiconductor substrate 700 and patterned by photolithography to form an etch mask 410 with mask openings 415.

Figure 2A:
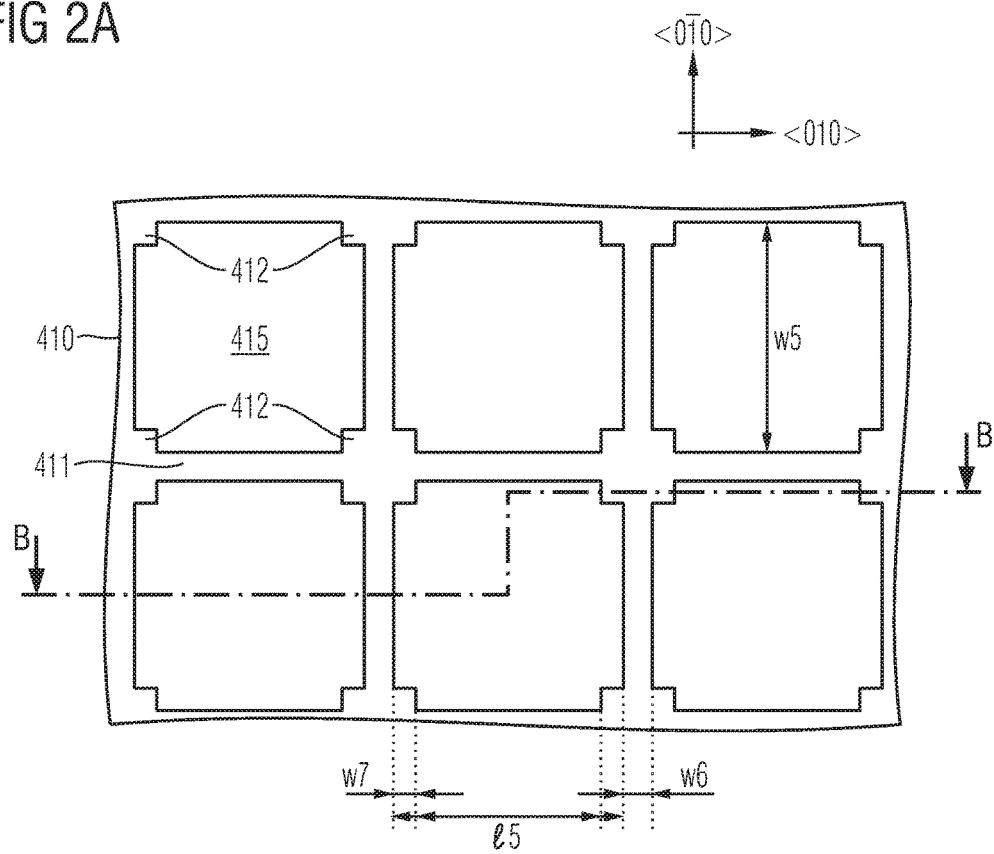
FIG. 2A is a schematic plan view of a semiconductor substrate for illustrating a method of manufacturing semiconductor devices according to an embodiment using an anisotropic wet etching for forming epitaxy troughs, after forming an etch mask.
Figure 2B:
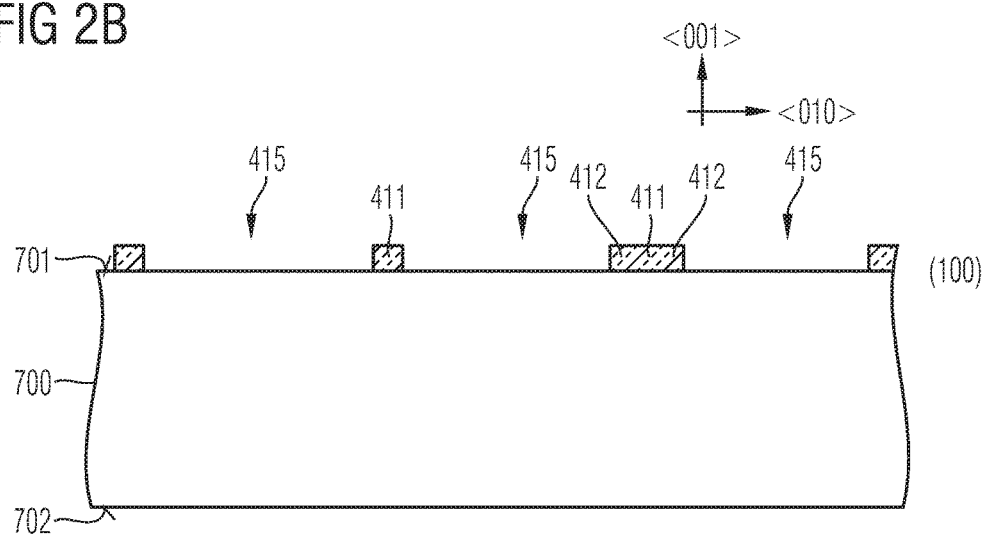
FIG. 2B is a schematic vertical cross-sectional view of the semiconductor substrate portion of FIG. 2A along line B-B.

FIGS. 2A and 2B show the etch mask 410 on the process surface 701 of the semiconductor substrate 700. The semiconductor substrate 700 may be an Fz:Si wafer or a Cz:Si wafer, wherein the process surface 701 may be a {001} crystal plane.

The etch mask 410 may include one single layer or may be a layer stack including two or more layers, for example, a layer of thermal oxide, a layer of silicon nitride formed by LPCVD (low pressure chemical vapor deposition), a-C:H (amorphous carbon hydrogen), DLC (diamond like carbon) or SiC (silicon carbide).

The mask openings 415 may be rectangles, for example squares, wherein concave corners of the mask openings 415 may include concave corner compensation features 412. Sidewalls of the mask openings 415 may be parallel to the <010> crystal direction and parallel to the <0-10> crystal direction. Opening length l5 and opening width w5 of the mask openings 415 as well as mask rib width w6 of rib portions 411 of the etch mask 410 are selected to achieve the target trough length l1 and target trough width w1 as illustrated in FIG. 1A and FIG. 2D below.

The etching process may include a wet etching with an isotropic component that undercuts the etch mask 410 to some degree. Highly isotropic etching may undercut the etch mask by about half of the trough depth v1 such that both l5 exceeds l1 by v1 and w5 exceeds w1 by v1.

According to an embodiment, the etching process includes anisotropic, crystal orientation-dependent wet etching recessing different crystal planes at different rates. For example, an alkaline solution, e.g., aqueous NaOH alkaline solution or aqueous KOH alkaline solution may be brought into contact with the semiconductor substrate 700 through the mask openings 415, wherein temperature and concentration of the alkaline solution is selected to achieve perpendicular sidewalk. For example, a KOH alkaline solution with a concentration of 25 wt % is applied at a temperature of 75° C.

Figure 2C:
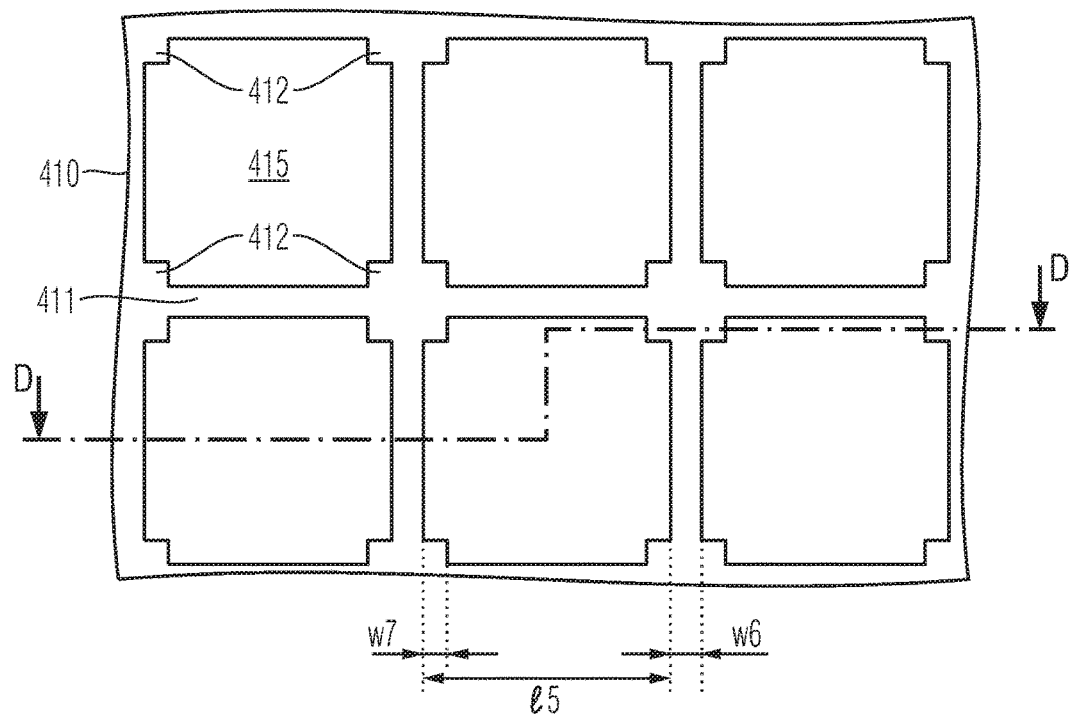
FIG. 2C is a schematic plan view of the semiconductor substrate portion of FIG. 2A, after forming epitaxy troughs.
Figure 2D:
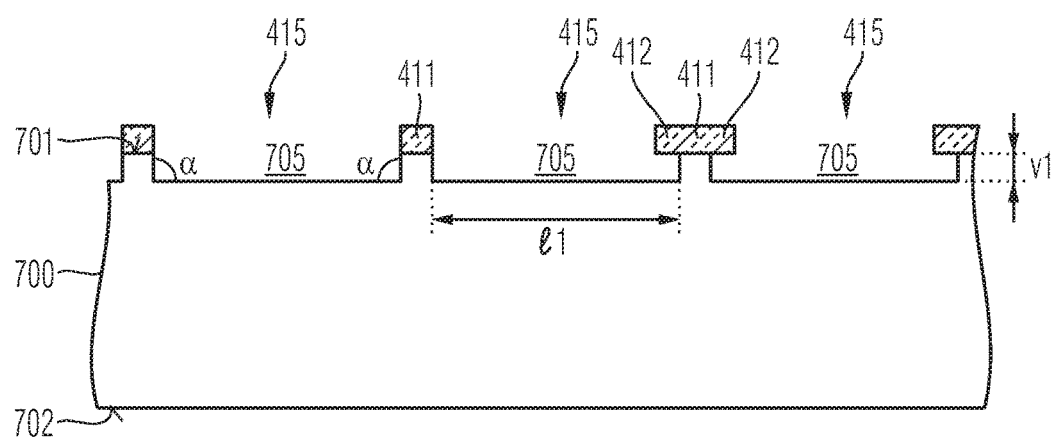
FIG. 2D is a schematic vertical cross-sectional view of the semiconductor substrate portion of FIG. 2C along line D-D.

FIGS. 2C and 2D show epitaxy troughs 705 obtained from anisotropic wet etching. At sufficiently high concentrations and at sufficiently low temperatures, wet etching exposes {100} crystal planes perpendicular to the process surface 701. In case that the process surface 701 is in a {001} crystal plane, suitable matched corner compensation features 412 may suppress to some degree the formation of {111} crystal planes in the corners of the epitaxy troughs 705.

According to other embodiments, the etch may be controlled such that upper first sections of the epitaxy troughs 705 are vertical {100} crystal planes, whereas lower second sections are {110} crystal planes with a slope angle α>90°, for example, about 135° with respect to a bottom 706 of the epitaxy troughs 705. {111} crystal planes may form in the corners of the lower second sections and may connect neighboring {110} crystal planes. For the formation of the {111} crystal planes in the corners, the corner compensation features 412 may be omitted.

Portions of the etch mask 410 undercut by the epitaxy troughs 705, e.g., the corner compensation features 412 may be removed. For example, a further wet etching may selectively remove the undercut material of the etch mask 410 with respect to the semiconductor substrate 700 to form an epitaxy mask 420.

Figure 2E:
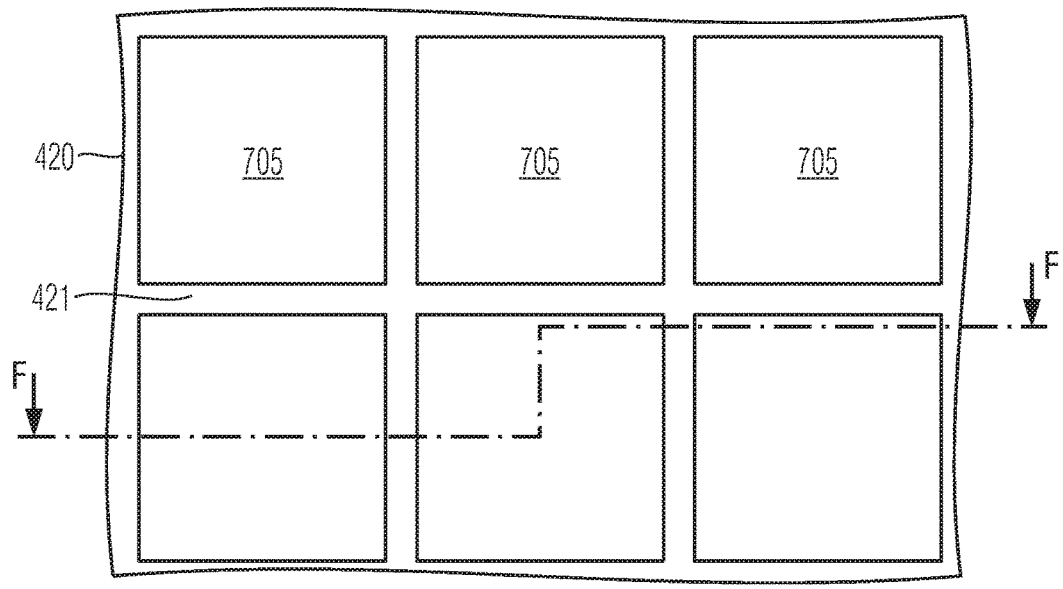
FIG. 2E is a schematic plan view of the semiconductor substrate portion of FIG. 2C, after removing undercut sections of the etch mask.
Figure 2F:
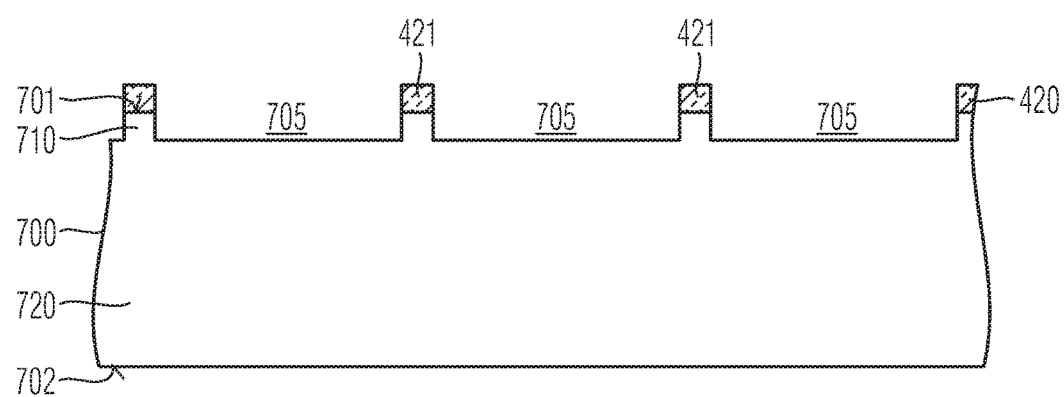
FIG. 2F is a schematic vertical cross-sectional view of the semiconductor substrate portion of FIG. 2E along line F-F.

FIGS. 2E and 2F show the epitaxy mask 420 without portions undercut by the epitaxy troughs 705 and with ribs 421, which may have the same width as the rib portions 411 of FIG. 2A. In case the wet etching undercuts the epitaxy mask 420, the ribs 421 may be narrower than the rip portions 411 of FIG. 2A. According to another embodiment, the etch mask 410 may be completely removed.

Ribs of the semiconductor substrate 700 between the epitaxy troughs 705 form a matrix section 710 and a portion of the semiconductor substrate 700 below the epitaxy troughs 705 a base section 720 of the semiconductor substrate 700. A first semiconductor material of at least rib sidewall sections of the matrix section 710 is defined by the base material of the semiconductor substrate 700, e.g., Cz:Si, or by a pretreatment that changes the concentration of at least one impurity and the porosity of at least rib sidewall sections.

Figure 2G:
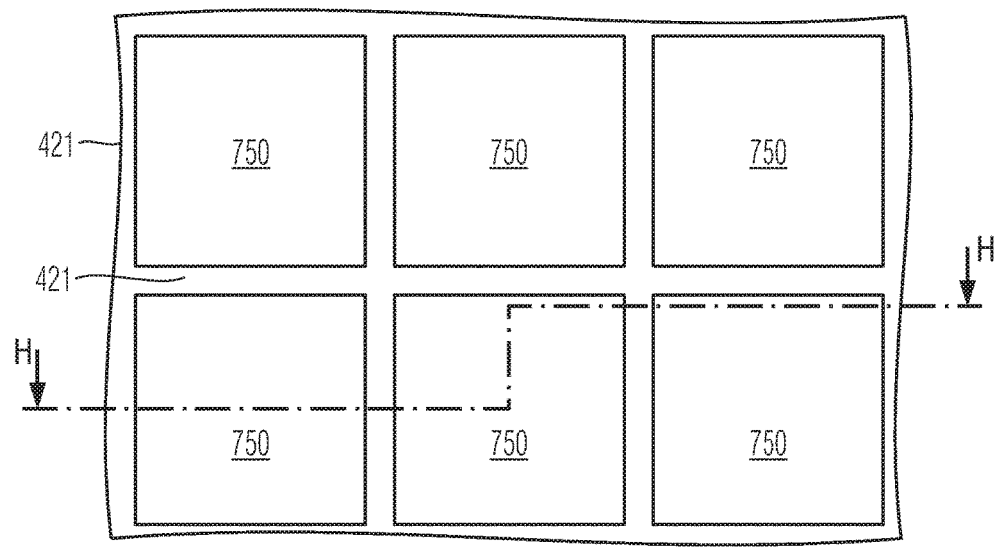
FIG. 2G is a schematic plan view of the semiconductor substrate portion of FIG. 2E, after epitaxy in the epitaxy troughs.
Figure 2H:
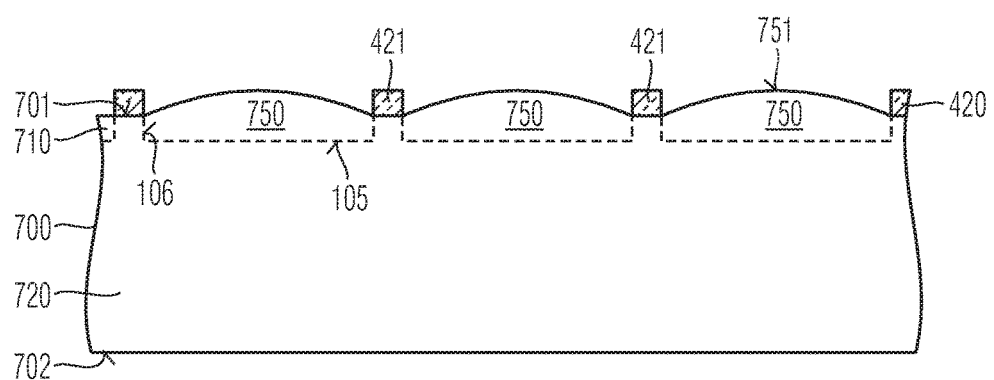
FIG. 2H is a schematic vertical cross-sectional view of the semiconductor substrate portion of FIG. 2G along line H-H.

In FIGS. 2G and 2H, an epitaxy mask 420 including ribs 421 suppresses the deposition of a second semiconductor material 750 on top of the ribs of the matrix section 710 during an epitaxy process that fills the epitaxy troughs 705 of FIG. 2F with the crystalline second semiconductor material 750. The crystal lattice of the second semiconductor material 750 grows in registry with the crystal lattice of the semiconductor substrate 700 and distinguishes from the first semiconductor material in the ribs of the matrix section 710 with respect to presence or concentration of impurities such as acceptors, donors, oxygen, nitrogen, carbon, and/or heavy metals, and/or with respect to the porosity.

The resulting epitaxy surface 751 of the second semiconductor material 750 is planarized either after removal of the epitaxy mask 420 or with the epitaxy mask 420 of FIG. 2H still present on the matrix section 710. In the illustrated embodiment, the epitaxy mask 420 is removed, e.g., by a selective wet etching process before planarizing the epitaxy surface 751.

Figure 2I:
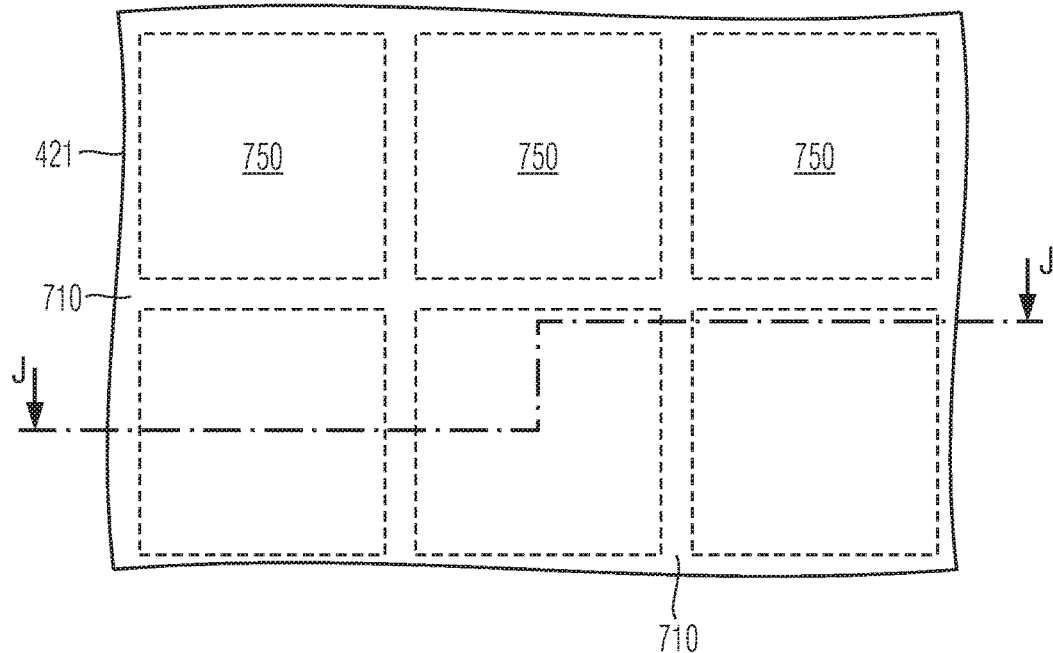
FIG. 2I is a schematic plan view of the semiconductor substrate portion of FIG. 2G, after removing the etch mask.
Figure 2J:
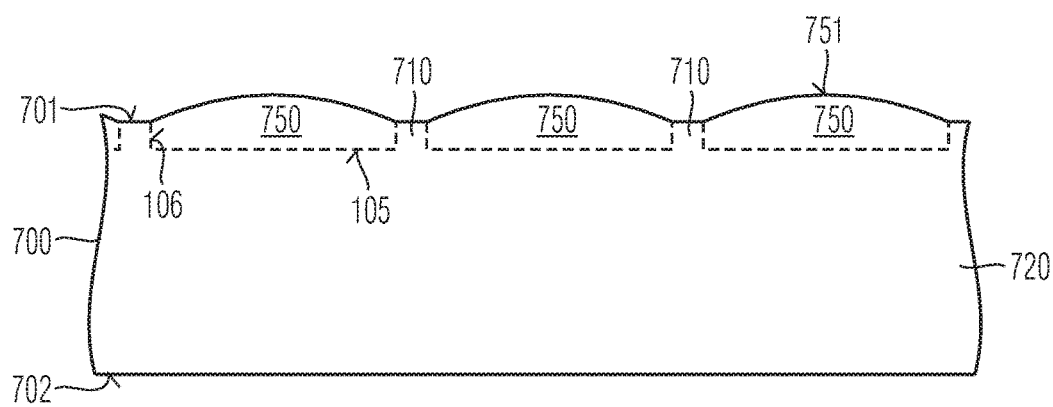
FIG. 2J is a schematic vertical cross-sectional view of the semiconductor substrate portion of FIG. 2I along line J-J.

FIGS. 2I and 2J show the semiconductor substrate 700 with sections of the second semiconductor material 750 separated by ribs of the exposed matrix section 710 of the semiconductor substrate 700.

A grinding and/or CMP (chemical mechanical polishing) planarizes the epitaxy surface 751 down to at least the process surface 701 on top of the ribs of the matrix section 710.

Figure 2K:
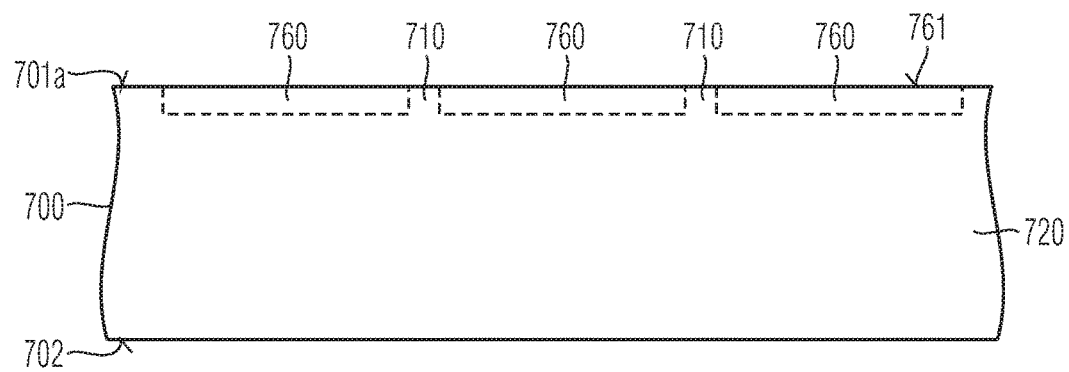
FIG. 2K is a schematic vertical cross-sectional view of the semiconductor substrate portion of FIG. 2J, after planarizing the material deposited by epitaxy.

FIG. 2K shows the planarized semiconductor substrate 700, wherein sections of the second semiconductor material 750 between ribs of the matrix section 710 form epitaxy regions 760 with planar surfaces 761. In the epitaxy regions 760 semiconducting, insulating and conductive structures of semiconductor devices are formed by a sequence of implant, etching, deposition and patterning processes.

A separation process separates semiconductor bodies 100 formed completely or mainly in the epitaxy regions 760 of FIG. 2K from the semiconductor substrate 700 along dicing streets 730.

Figure 2L:
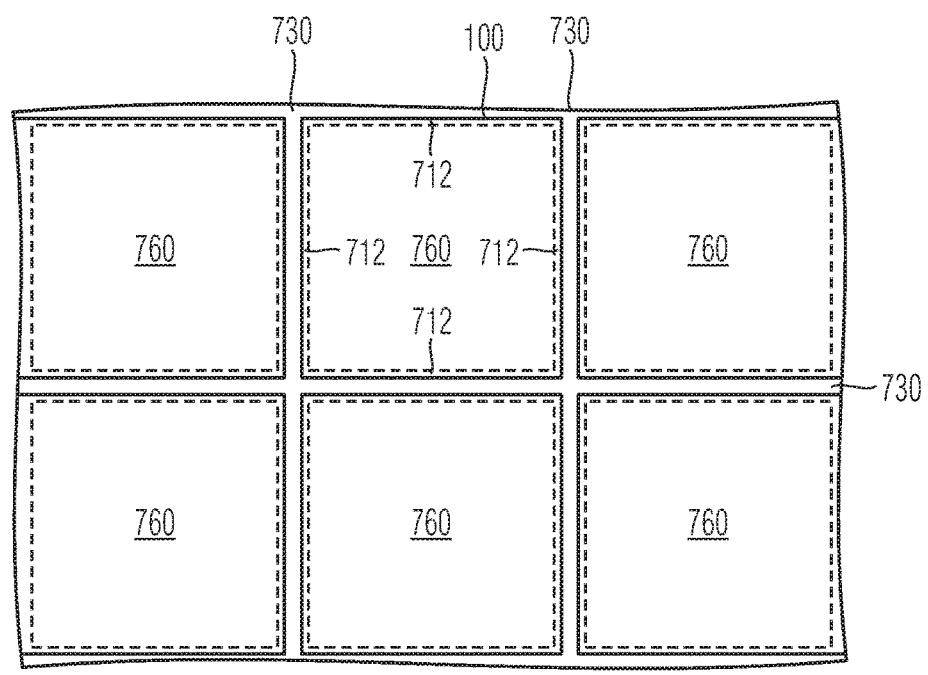
FIG. 2L is a schematic plan view of dicing streets in the semiconductor substrate portion of FIG. 2K.

FIG. 2L shows dicing streets 730 running within the ribs of the matrix section 710. The separation process includes a process of thinning the base section 720 of the semiconductor substrate 700 or splitting off at least a portion of the base section 720. In the illustrated example, each semiconductor body 100 includes one epitaxy region 760 and directly adjoining rib sidewall sections 712 of the matrix section 710.

FIGS. 3A to 3D concern an embodiment using the epitaxy mask 420 for controlling the planarization process of the epitaxy surface 751.

Starting from the epitaxy mask 420 as illustrated in FIGS. 2E and 2F, the epitaxy process is controlled such that the second semiconductor material 750 at least partially overgrows the epitaxy mask 420 and such that the epitaxy surface 751 is above the upper edge of the epitaxy mask 420.

Figure 3A:
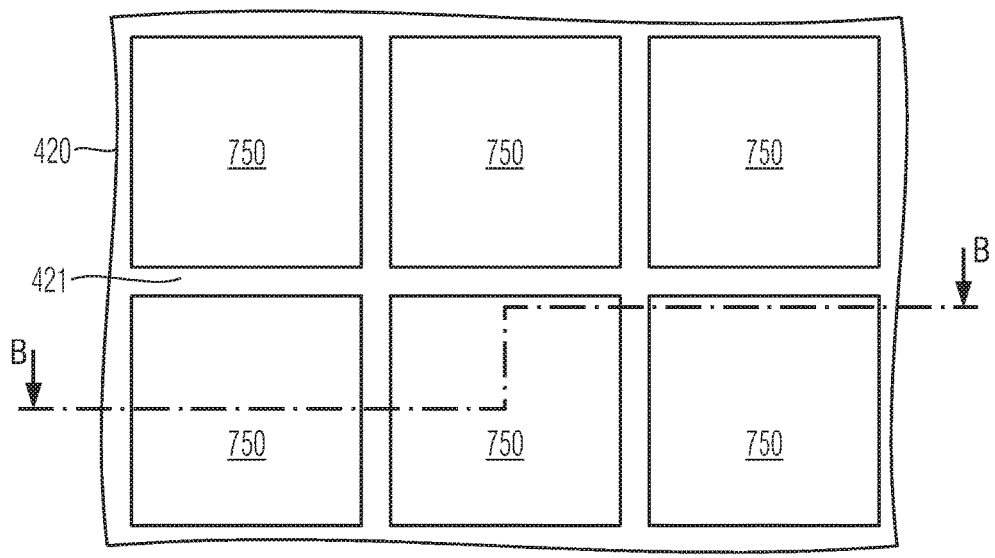
FIG. 3A is a schematic plan view of a semiconductor substrate portion according to an embodiment including an epitaxial overfill of epitaxy troughs, after overgrowing the etch mask.
Figure 3B:
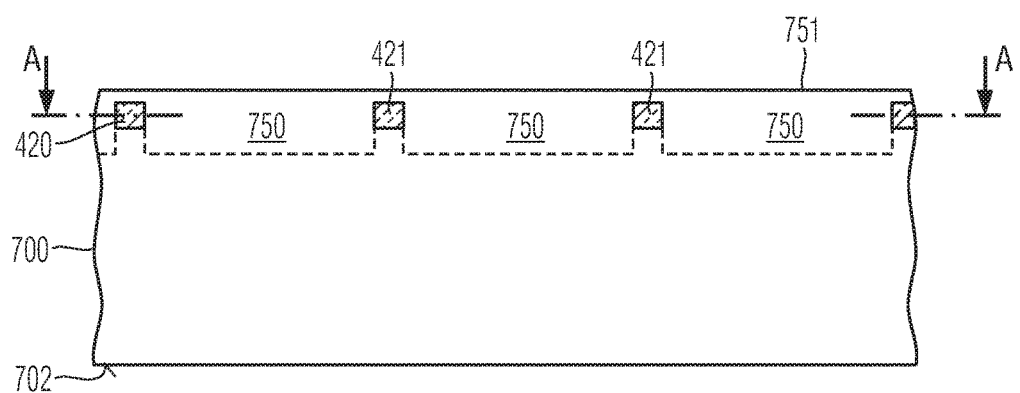
FIG. 3B is a schematic vertical cross-sectional view of the semiconductor substrate portion of FIG. 3A along line B-B.

FIGS. 3A and 3B show the epitaxial second semiconductor material 750 filling the epitaxy troughs 705 of FIG. 2F and embedding the epitaxy mask 420. Grinding and/or polishing processes may use exposure of the epitaxy mask 420 for controlling the end of the grinding and polishing process.

Figure 3C:
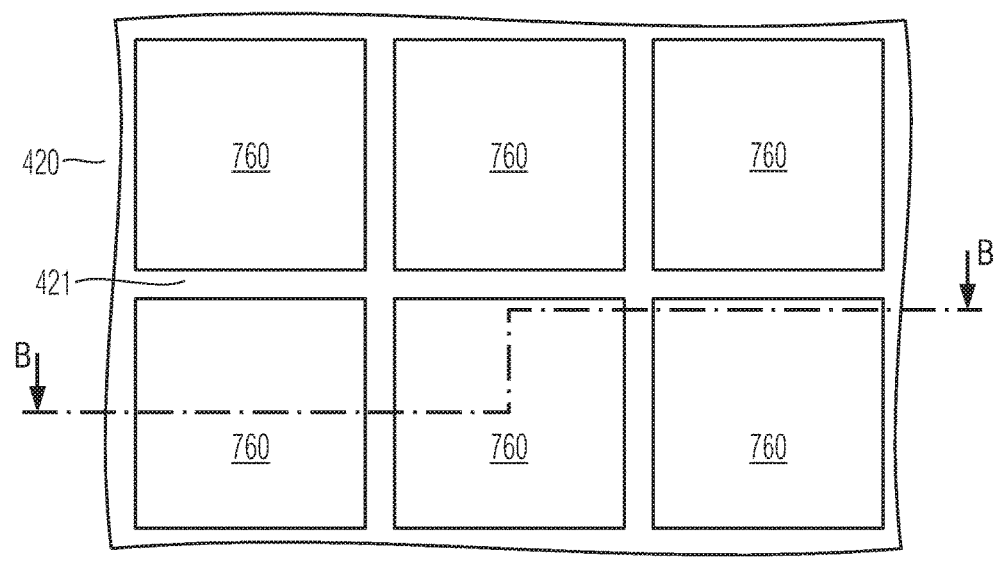
FIG. 3C is a schematic plan view of the semiconductor substrate portion of FIG. 3A, after a planarizing process using the etch mask as etch stop.
Figure 3D:
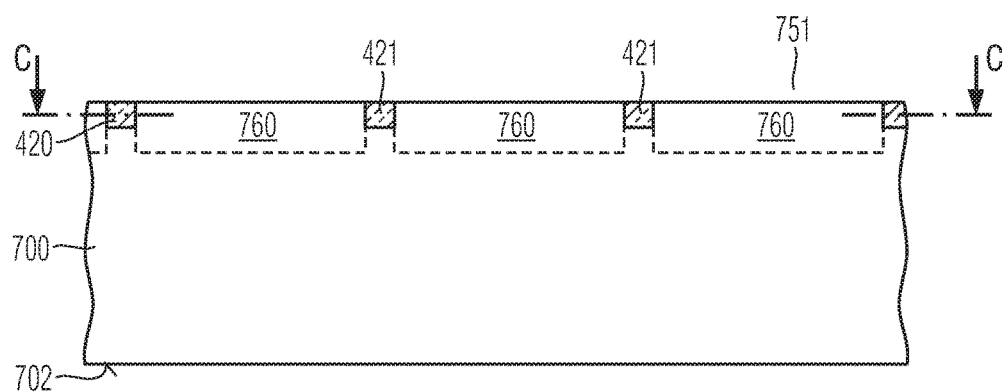
FIG. 3D is a schematic vertical cross-sectional view of the semiconductor substrate portion of FIG. 3C along line D-D.

As illustrated in FIGS. 3C and 3D the exposed ribs 421 of the epitaxy mask 420 may improve overall flatness and uniformity of the planar surfaces 761 of the epitaxy regions 760 across the complete semiconductor substrate 700.

Differences between the crystalline first semiconductor material in the ribs of the matrix section and the second semiconductor material grown by epitaxy in the epitaxy troughs as regards impurity content and morphology, e.g., porosity can be used to pattern a section of a semiconductor body along the lateral surface across the complete vertical extension of the lateral surface. For example, concentration differences of certain impurities in the first and second semiconductor materials may be used to diffuse impurities from the ribs of the matrix section through the lateral surface into the epitaxy regions or vice versa, wherein the impurities locally change the electric characteristics, for example, net dopant concentration, conductivity type, or charge carrier lifetime and/or mechanical strength of either an outer edge section of the epitaxy region directly adjoining the ribs of the matrix section or in lateral portions of the ribs of the matrix section directly adjoining the epitaxy regions, wherein the lateral portions or at least a part of the lateral portions of the ribs may get part of the semiconductor bodies that in the rest include the epitaxy regions.

Figure 4A:
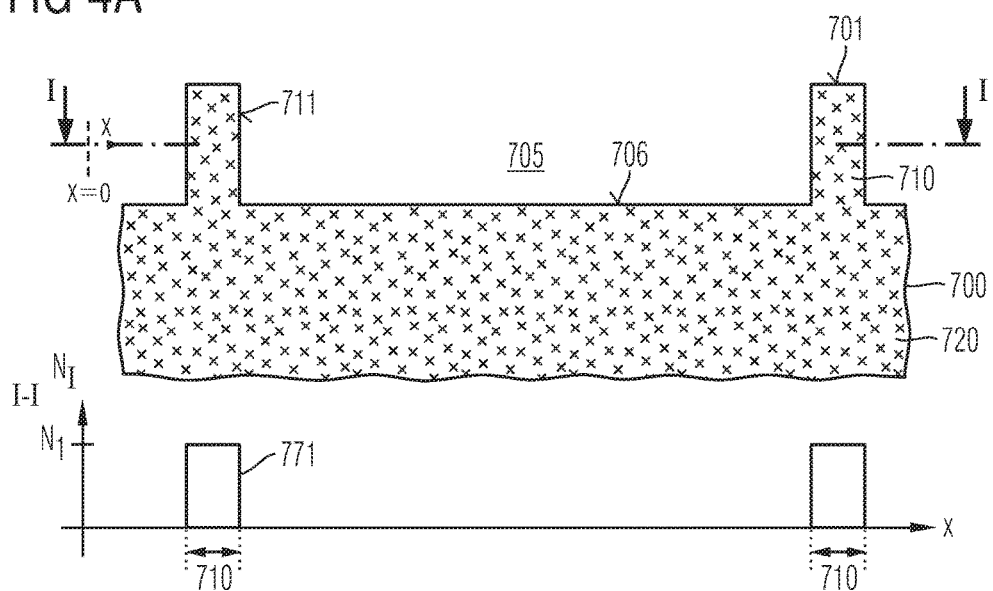
FIG. 4A is a schematic vertical cross-sectional view of a portion of a semiconductor substrate for illustrating a method of manufacturing semiconductor devices according to an embodiment referring to a lateral diffusion of impurities into lateral edge sections of epitaxy regions, after forming epitaxy troughs.
Figure 4B:
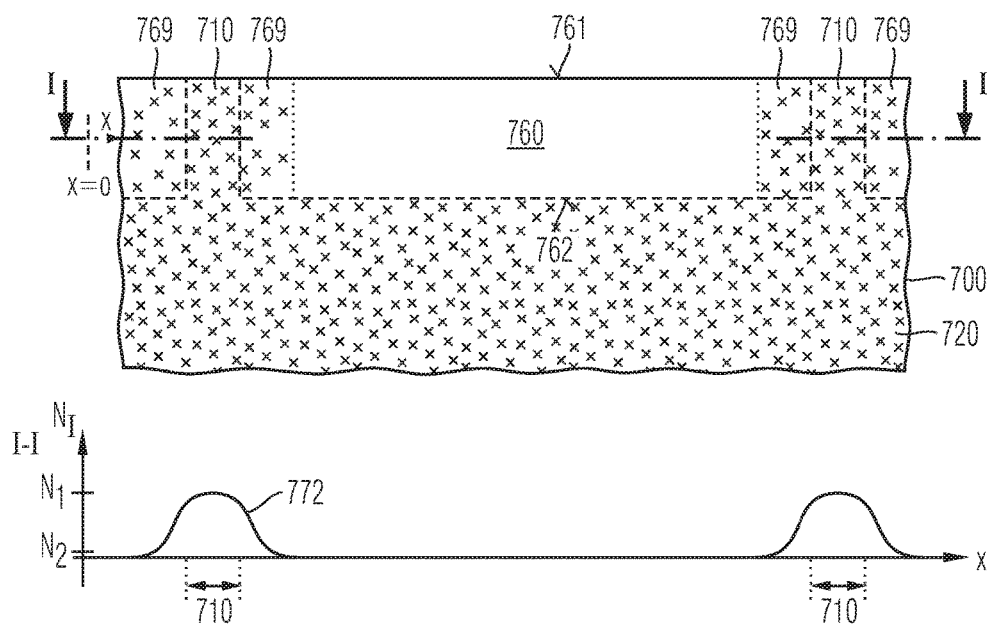
FIG. 4B is a schematic vertical cross-sectional view of the semiconductor substrate portion of FIG. 4A, after diffusion of the impurities into lateral edge sections of the epitaxy regions.

FIGS. 4A and 4B concern out diffusion of impurities from at least the ribs of the matrix section 710 into an epitaxy region 760. Epitaxy troughs 705 are formed in a semiconductor substrate 700 as described above.

FIG. 4A shows ribs of a matrix section 710 of a first semiconductor material containing impurities, wherein the ribs separate neighboring epitaxy troughs 705. The first semiconductor material of the matrix section 710 may be the same as the material of the base section 720. For example, the semiconductor substrate 700 is a Cz:Si wafer with a comparatively high oxygen content, high nitrogen content and/or high carbon content.

In a lateral cross-section parallel to the process surface 701 a first horizontal concentration profile 771 of the impurity shows, for example, an approximately uniform distribution with a mean value N1 within the ribs of the matrix section 710. Alternatively, the distribution can be Gaussian-like for the case that impurities have been implanted and in-diffused into the sidewalls of the ribs or can exhibit a complementary error function (erfc(x))-like profile for the case that the impurities have been in-diffused into the sidewalls from the gas phase.

A second semiconductor material is grown by epitaxy in the epitaxy trough 705 of FIG. 4A and planarized to form epitaxy regions 760. In the deposited second semiconductor material, a mean concentration N2 of the impurity is significantly lower than in the matrix section 710, for example, by at least one or by at least two orders of magnitude.

During epitaxial growth and/or during heating treatments applied after epitaxial growth, impurities horizontally diffuse out from the ribs of the matrix section 710 into lateral edge sections 769 of the epitaxy regions 760. The heating treatments maybe dedicated heating treatments exclusively aiming at diffusing out the impurities from the ribs of the matrix section 710 into the lateral edge sections 769 or may be heating treatments used during the formation of a semiconductor body of a semiconductor device in the epitaxy region 760. After the heating treatment, a second horizontal concentration profile 772 of the impurity includes, for example, Gaussian distributions centered to the ribs of the matrix sections 710 and laterally spreading into the lateral edge sections 769. Apart from diffusion occurring during the epitaxy, the horizontal dopant profile is essentially the same along the complete vertical extension of the epitaxy region 760 between the planar surface 761 and a bottom surface 762 of the epitaxy region 760.

Impurities may also diffuse from the base section 720 through the bottom surface 762 of the epitaxy region 760. Diffusion through the bottom surface 762 may be suppressed by passivation of the bottom surface 762, e.g., by selective formation of a passivation layer at the bottom 706 of the epitaxy troughs of FIG. 4A. A lower portion of the epitaxy region 760 directly adjoining the bottom surface 762 and containing indiffused impurities may become part of a semiconductor body obtained from the epitaxy region 760 in the rest. Alternatively, a grinding process from the back may remove portions of the epitaxy regions 760 affected by diffusion through the bottom surface 762 of the epitaxy regions 760.

The difference in impurity content between the first semiconductor material in the ribs of the matrix section 710 and the second semiconductor material formed in the epitaxy troughs 705 may result from the properties of the original semiconductor substrate 700 or from a pretreatment of at least the matrix section 710. The pretreatment may include outdiffusion from impurities from a solid impurity source temporarily deposited along at least the rib sidewalls 711 of the matrix section 710, by outdiffusion from a gaseous phase or by one or more implants.

Figure 5A:
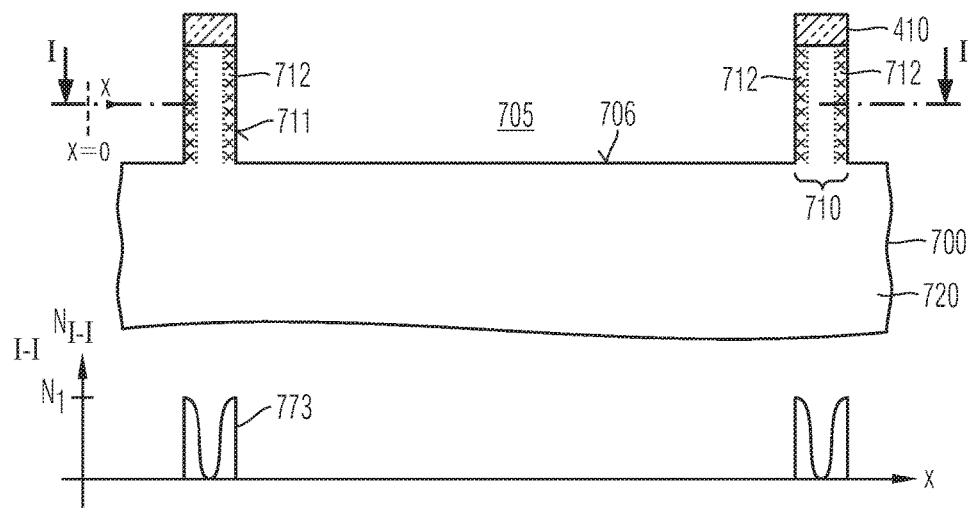
FIG. 5A is a schematic vertical cross-sectional view of a portion of a semiconductor substrate for illustrating a method of manufacturing semiconductor devices according to an embodiment including implantation of impurities into rib sidewall sections of a matrix section of a semiconductor substrate, after implanting the impurities.
Figure 5B:
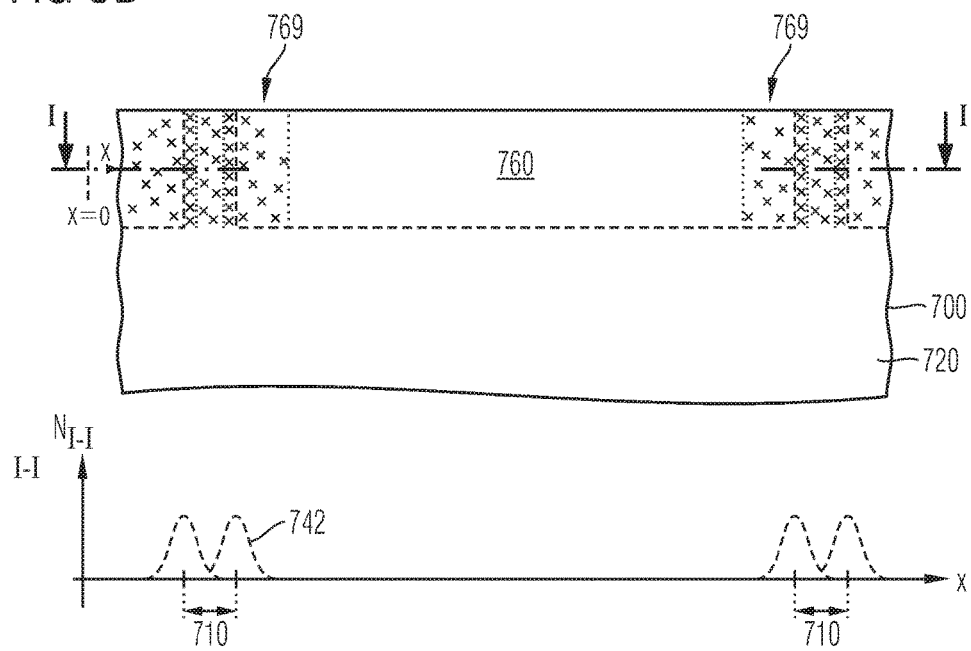
FIG. 5B is a schematic vertical cross-sectional view of the semiconductor substrate portion of FIG. 5A, after diffusion of the impurities into lateral edge sections of the epitaxy regions.

FIGS. 5A to 5B refer to introducing impurities, for example donors, acceptors, oxygen, carbon, nitrogen or heavy metal atoms into rib sidewall sections 712 of the matrix section 710.

For example, impurities are implanted with the epitaxy mask 420 covering top surfaces of the ribs of the matrix section 710, wherein an implant beam is tilted to the vertical direction and impurities are selectively implanted into the rib sidewall sections 712 of the matrix section 710. A third horizontal concentration profile 773 of the implanted impurities includes maxima at or close to the rib sidewalls 711. Within each rib the implanted rib sidewall sections 712 may be separated from each other.

During and/or after epitaxial growth of the second semiconductor material the implanted impurities diffuse out from the rib sidewall sections 712 into the lateral edge sections 769 of the epitaxy regions 760. For example, the semiconductor substrate 700 may be an Fz:Si wafer with a comparatively low concentration of oxygen and the implanted impurities are oxygen atoms.

FIG. 5B shows the lateral edge sections 769 containing the impurities diffused out from the matrix section 710. A fourth horizontal concentration profile 774 of the diffused impurities may show two overlapping Gaussian distributions per rib of the matrix Section 710.

FIGS. 6A to 6D refer to the formation of a vertical p-doped region in an edge region of a semiconductor body of a semiconductor device.

Figure 6A:
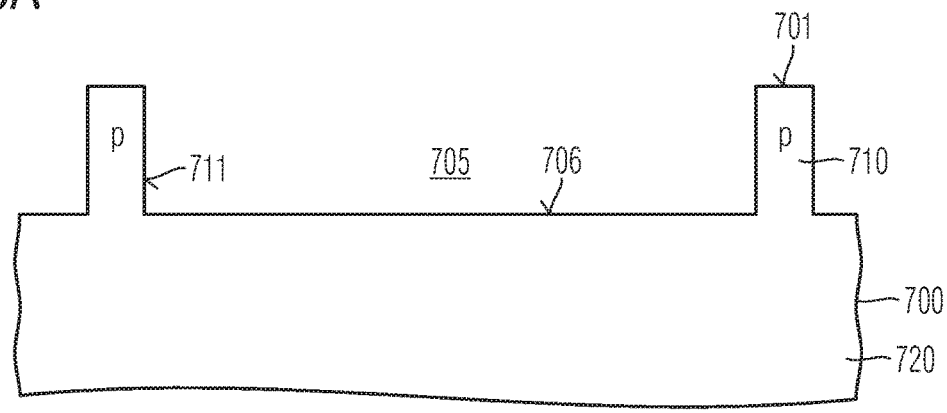
FIG. 6A is a schematic vertical cross-sectional view of a portion of a semiconductor substrate for illustrating a method of manufacturing semiconductor devices according to an embodiment including diffusion of dopants from the matrix section into the epitaxy regions.

According to FIG. 6A at least a matrix section 710 of a semiconductor substrate 700 as described above includes a significant content of dopants, e.g., acceptor atoms. The acceptor content may be given by the starting material used as semiconductor substrate 700, which may be a heavily doped p-type Cz:Si wafer or may be increased in a pretreatment, for example, by implanting acceptor ions before or after forming epitaxy troughs 705.

An epitaxy process forms lightly doped n-type epitaxy regions 760 in the epitaxy troughs 705 of FIG. 6A. Then semiconductor bodies 100 of semiconductor devices are formed, wherein each semiconductor body 100 is formed mainly or completely in one of the epitaxy regions 760 by a sequence of implants, etches, deposition and patterning processes.

Figure 6B:
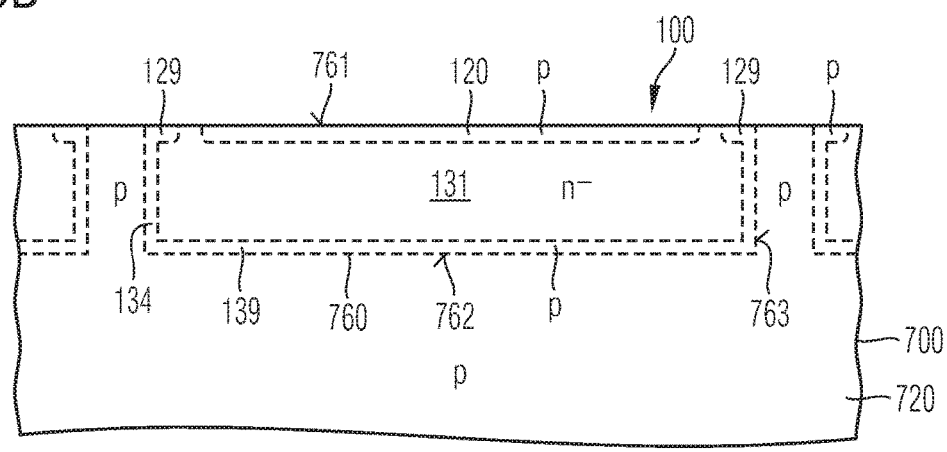
FIG. 6B is a schematic vertical cross-sectional view of the semiconductor substrate portion of FIG. 6A, after forming semiconductor bodies of semiconductor devices in the epitaxy regions.

As illustrated in FIG. 6B, formation of a semiconductor body too may include forming a p-type anode/body well 120 between the planar surface 761 of an epitaxy region 760 and a lightly doped n-type drift zone 131 formed by the originally deposited epitaxy material. The anode/body well 120 may form body regions of transistor cells of an IGBT or may separate a further n-type well 110 from the drift zone 131 in case the semiconductor body 100 is that of a thyristor. A p-type edge region 129 spaced from the anode/body well 120 may surround the anode/body well 120 along the planar surface 761.

During epitaxy or during heating treatments applied after epitaxy, acceptor atoms diffuse out from the matrix section 710 through lateral surfaces 763 of the epitaxy regions 760. In addition, acceptor atoms may diffuse from the base section 720 of the semiconductor substrate 700 through the bottom surface 762 of the epitaxy region 760 into the epitaxy region 760.

Acceptor atoms diffused through the lateral surface 763 may form a vertical p-type region 134 along the lateral surface 763. Acceptor atoms diffused through the bottom surface 762 of the epitaxy region 760 may form a horizontal electrode/emitter layer 139 or may at least contribute to the formation of the horizontal electrode/emitter layer 139.

After removing the base section 720 further processes may be applied to a rear side of semiconductor bodies 100 mainly or completely formed from the epitaxy regions 760. For example, a further implant from the back may increase the dopant concentration in the horizontal electrode/emitter layer 139.

A separation process may define semiconductor bodies 100 such that the semiconductor bodies 100 include exclusively the second semiconductor material deposited into the epitaxy troughs 705 of FIG. 6A or such that the semiconductor bodies 100 further include adjoining portions of the base section 720 of the semiconductor substrate 700, rib sidewall sections 712 of the matrix section 710, or both.

Figure 6C:
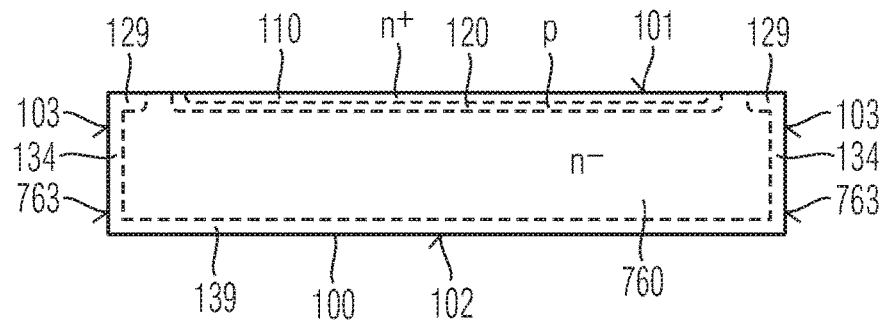
FIG. 6C is a schematic vertical cross-sectional view of a semiconductor body obtained from the semiconductor substrate of FIG. 6B by a separation process removing the complete matrix section.

In FIG. 6C the semiconductor body 100 exclusively includes the epitaxy region 760 of FIG. 6B. The vertical p-type region 134 connects the circumferential p-type edge region 129 with the horizontal electrode/emitter layer 139 along the lateral surface 103, which coincides with the lateral surface 763 of the epitaxy region 760 of FIG. 6B. The vertical p-type region 134 enables, for example, the realization of IGBTs with reverse blocking capability.

Figure 6D:
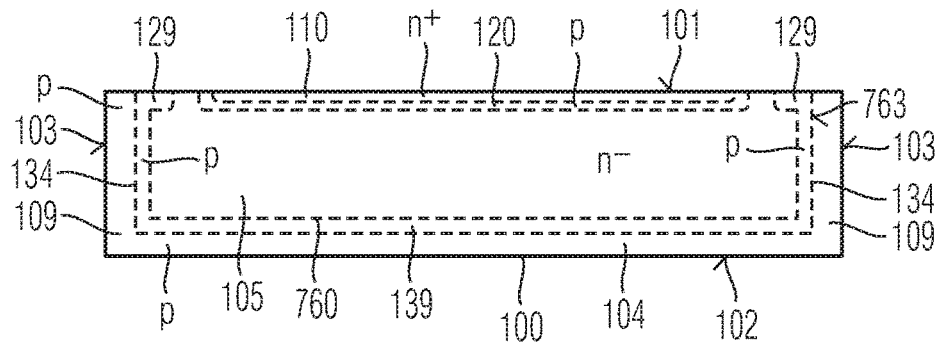
FIG. 6D is a schematic vertical cross-sectional view of the semiconductor body obtained from the semiconductor substrate of FIG. 6B by a separation process selectively removing a central portion of the matrix section.

In FIG. 6D, the separation process leaves semiconductor bodies 100 including a lateral body portion 109 based on the first semiconductor material of the matrix section 710 as well as a base portion 104 of the base section 720. A main body portion 105 corresponds to one epitaxy region 760.

The horizontal electrode/emitter layer 139 may be formed exclusively by the base portion 104, may exclusively be formed by indiffusion from the base section 720 as illustrated in FIG. 6C or may be a combination of both as illustrated in FIG. 6D. In case the horizontal electrode/emitter layer 139 is formed from the base portion 104, an oxygen concentration in the electrode/emitter layer 139 exceeds an oxygen concentration in the main body portion 105 by at least one or two orders of magnitude.

The vertical p-type region 134 may be exclusively formed from a rib sidewall section of the matrix section, may be exclusively formed by diffusion through the lateral surfaces 763 of the epitaxy region 760 as illustrated in FIG. 6C or may be a combination of both as illustrated in FIG. 6D. In case the vertical p-type region 134 is formed from the rib sidewall section of the matrix section, an oxygen concentration in the vertical p-type region 134 exceeds an oxygen concentration in the main body portion 105 by at least one or two orders of magnitude.

Figure 7A:
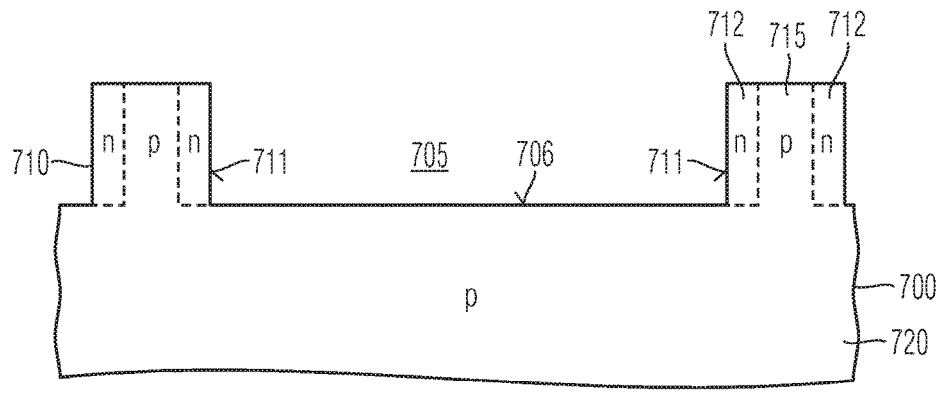
FIG. 7A is a schematic vertical cross-sectional view of a portion of a semiconductor substrate for illustrating a method of manufacturing semiconductor devices according to an embodiment including the formation of lateral body portions of semiconductor devices in rib sidewall sections of the matrix section.
Figure 7B:
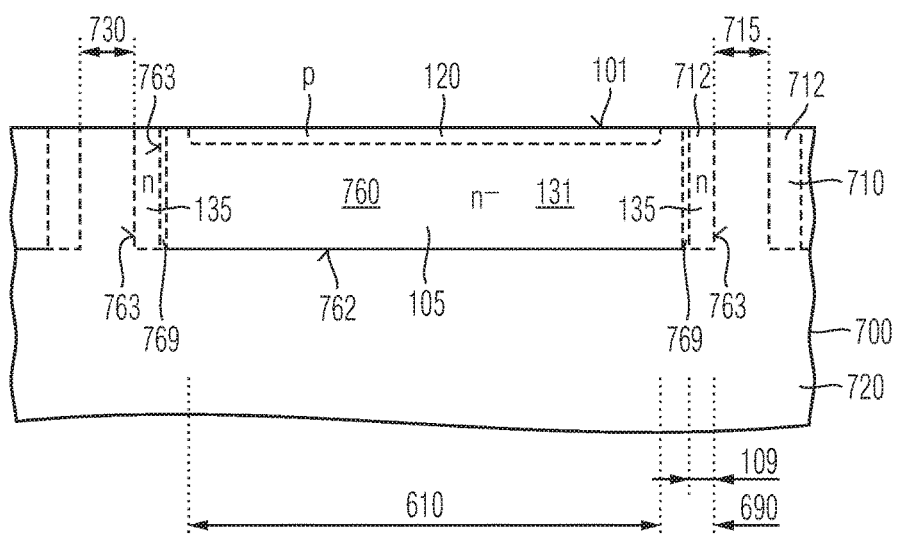
FIG. 7B is a schematic vertical cross-sectional view of the semiconductor substrate portion of FIG. 7A, after forming epitaxy regions including main and lateral body portions.

FIGS. 7A and 7B refer to the formation of a lateral n-type field stop.

The semiconductor substrate 700 illustrated in FIG. 7A may be a Cz:Si wafer, which may be approximately intrinsic, n-type or p-type. Epitaxy troughs 705 are formed as described above.

Donor atoms, for example arsenic, phosphorus, sulfur or selenium atoms are implanted at least into rib sidewall sections 712 of the matrix section 710, wherein a top surface of the matrix section 710 may be exposed or may be covered by remnants of an etch mask defining the epitaxy troughs 705. In case of a tilted implant, the bottom 706 of the epitaxy troughs 705 may be shadowed by the ribs of the matrix section 710. According to other embodiments, the donor atoms are also implanted through the bottom 706 of the epitaxy troughs 705. A central rib section 715 devoid of implanted donor atoms may separate the implanted rip sidewall sections 712.

An epitaxy process forms epitaxy regions 760 including a lightly n-type drift zone 131 in the epitaxy troughs 705 of FIG. 7A, wherein the n-type dopants previously implanted into the matrix section 710 may partially diffuse through the lateral surfaces 763 of the epitaxy regions 760 into lateral edge sections 769 of the epitaxy regions 760.

A separation process separating semiconductor bodies 100 from the semiconductor substrate 700 defines the lateral surfaces 103 of the semiconductor body 100.

FIG. 7B refers to an embodiment, in which the separation process only removes a central rib section 715 of the matrix section 710 and each semiconductor body 100 includes a circumferential lateral body portion 109 based on the first semiconductor material, wherein the lateral body portion 109 surrounds a rectangular, e.g., square main body portion 105 from the second semiconductor material. A vertical field stop 135 includes a first portion formed in the rib sidewall section 712 of FIG. 7A and may include a second portion formed by outdiffusion into the lateral edge section 769 of the epitaxy region 760.

According to another embodiment the separation process may remove the complete matrix section 710 such that the lateral surface 103 of the semiconductor body 100 coincides with the lateral surface 763 of the epitaxy region 760 and the vertical field stop 135 is formed exclusively by outdiffusion from the rib sidewall section 712 of FIG. 7A. In operation of a semiconductor device obtained from the semiconductor body 100, the vertical field stop 135 bars the lateral electric field from reaching the lateral surface 103 of the semiconductor body 100.

In case the implant is also effective through the bottom 706 of the epitaxy troughs 705, a portion of a horizontal field stop layer may be formed in the base section 720 or by outdiffusion from a sacrificial layer including the implanted dopants. If the substrate has a sufficient high donor concentration, these donor atoms can also be used for lateral outdiffusion into the semiconductor substrate 700, whereby this outdiffused n-type layer and optionally also the donor atoms in the matrix section 710 can serve as lateral channel stopper.

Figure 8A:
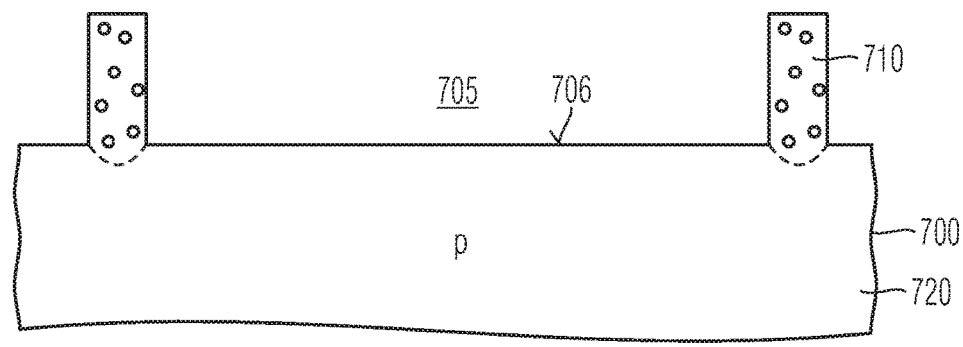
FIG. 8A is a schematic vertical cross-sectional view of a portion of a semiconductor substrate for illustrating a method of manufacturing semiconductor devices according to an embodiment including increasing porosity in a matrix section of a semiconductor substrate.
Figure 8B:
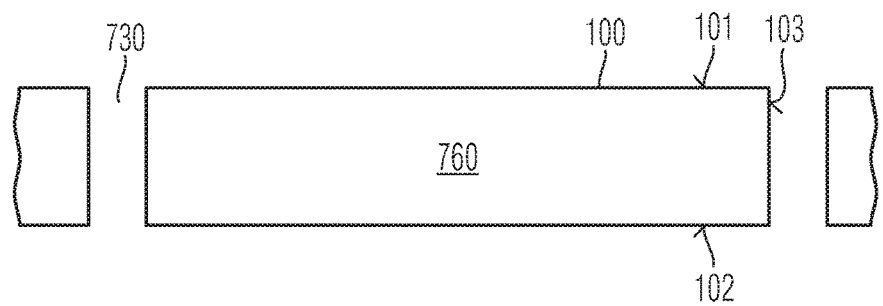
FIG. 8B is a schematic vertical cross-sectional view of a semiconductor body obtained by selectively removing the porous matrix section.

FIGS. 8A to 8B refer to embodiments using regions of increased porosity for a separation process.

After forming epitaxy troughs 705 and prior to epitaxy in the epitaxy troughs 705 as described above, a process of generating nanoscale or microscale cavities in a crystal lattice increases the porosity of at least portions of the matrix section 710. For example, a solution containing fluorine (F) is applied to perform an anodic oxidation of silicon or silicon carbide. According to an embodiment, the solution may contain hydrofluoric acid (HF) and at least one of ethanol and acetic acid. According to other embodiments, the solution may include mixtures of HF and dimethylformamide, hydrofluoric acid and acenitrile. The process of increasing porosity may include irradiating the semiconductor substrate 700 with radiation, e.g., light to induce a photochemical reaction that increases porosity selectively in p-type semiconductor material and that leaves n-type semiconductor material rather unaffected. A mask layer may cover horizontal portions of the semiconductor substrate 700 such that the process of increasing porosity is only effective in the matrix section 710.

The process of increasing porosity generates a multitude of cavities, e.g., mesa-pores and/or nano-pores, wherein a maximum diameter of the nano-pores is below 2 nm and the diameter of mesa-pores is between 2 nm and 100 nm. Porosity is the fraction of free space in all pores compared to the complete volume of the matrix section 710 and is a value between 0% and 100%. Though containing pores, a porous crystalline layer is still crystalline and suitable as a base for epitaxial growth.

In FIG. 8A, the second semiconductor material forming at least portions of the matrix section 710 is defined by a porosity of at least 5%, e.g., at least 20%, for example at least 50%. Optionally, an annealing step in hydrogen-containing atmosphere will be applied prior to the epitaxial deposition step. This annealing may facilitate the epitaxy process due to a smoothening of the surface of the porous sidewall of the matrix.

Epitaxy regions 760 are formed in the epitaxy troughs 705 of FIG. 8A as described above. A separation process that may be applied before or after removal of the base section 720 of the semiconductor substrate 700 of FIG. 8A removes the porous first semiconductor material of the matrix section 710 selectively with respect to the non-porous solid second semiconductor material of the epitaxy regions 760. The separation process may consume the material of the semiconductor substrate 700 in dicing streets 730. The lateral width of the dicing streets 730 may be equal to the rib width of the ribs of the matrix section 710. The separation process may include a selective etch, because porous silicon can be etched much faster than non-porous silicon, or a treatment with hydrogen in combination with a heating treatment. Introduction of hydrogen into a porous semiconductor reallocates the pores along a plane such that the connection between two neighboring semiconductor bodies 100 breaks up or can be easily broken up mechanically without impact on the crystal quality along the lateral surfaces 103 of semiconductor bodies 100 obtained from the semiconductor substrate 700.

FIGS. 9A to 9J refer to details of a separation process using a porous matrix section for simplifying separation of semiconductor bodies from a semiconductor substrate, wherein a process locally increases porosity of a semiconductor material by a photochemical reaction selectively effective only on one conductivity type, e.g., on p-type semiconductor material.

Epitaxy troughs 705 are formed in a process surface 701 of a semiconductor substrate 700 as described above.

Figure 9A:
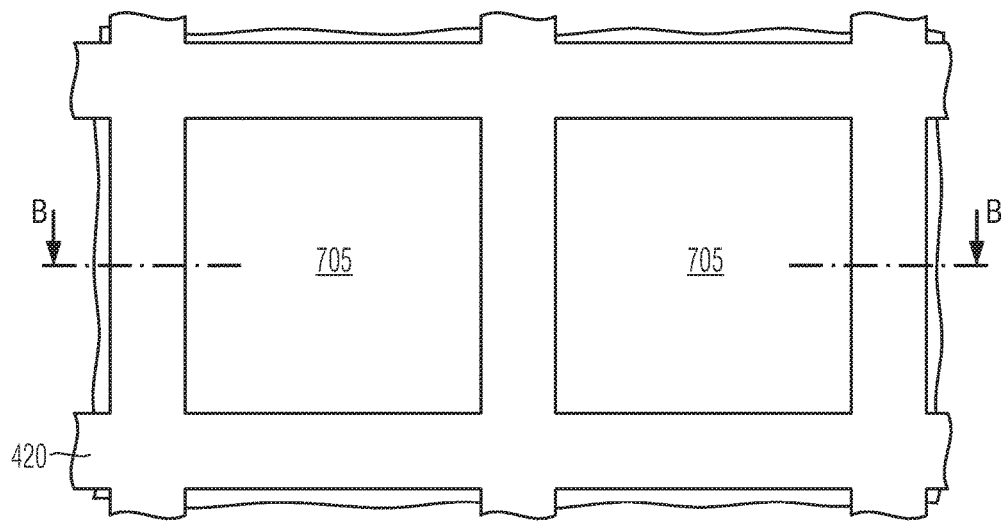
FIG. 9A is a schematic plan view of a semiconductor substrate portion for illustrating a method of manufacturing semiconductor devices by using increased porosity in a matrix section for a separation process, after implanting impurities through the bottom of epitaxy troughs.

FIG. 9A shows the epitaxy troughs 705 extending from the process surface 701 into the semiconductor substrate 700. The semiconductor substrate 700 may be p-doped. The epitaxy troughs 705 are arranged in lines and columns and are separated by ribs of a matrix section 710 of the semiconductor substrate 700. The bottom 706 of the epitaxy troughs 705 exposes portions of a continuous base section 720 from which the ribs of the matrix section 710 protrude. An epitaxy mask 420 may cover the process surface 701 which forms the top surfaces of the ribs of the matrix section 710.

A vertical implant may introduce donor atoms through the bottom 706 of the epitaxy troughs 705 in exposed portions of the base section 720. The implant locally changes the conductivity type from p-type to n-type and forms passivation regions 729 forming pn junctions with the rest of the base section 720.

Figure 9B:
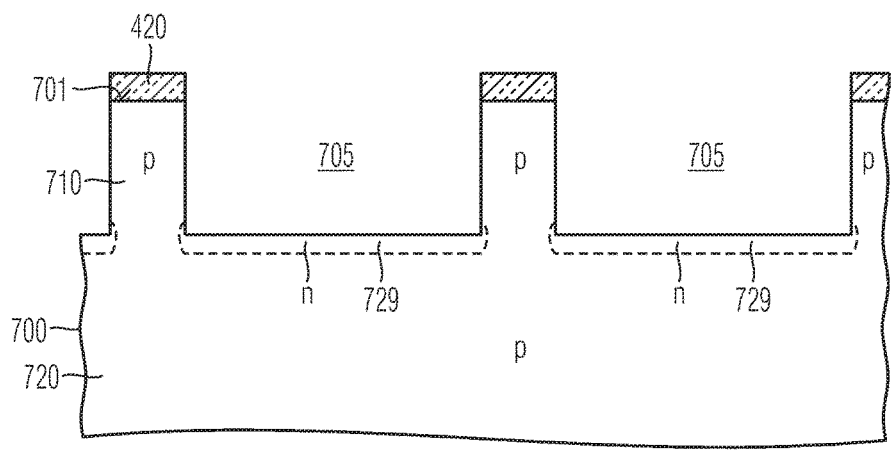
FIG. 9B is a schematic vertical cross-sectional view of the semiconductor substrate portion of FIG. 9A.

FIG. 9B shows passivation regions 729 of a conductivity type opposite to that of the matrix section 710 along the bottom 706 of the epitaxy troughs 705. A process increasing porosity in a semiconductor lattice is applied. For example, a solution including HF is applied that fills the epitaxy troughs 705.

Figure 9C:
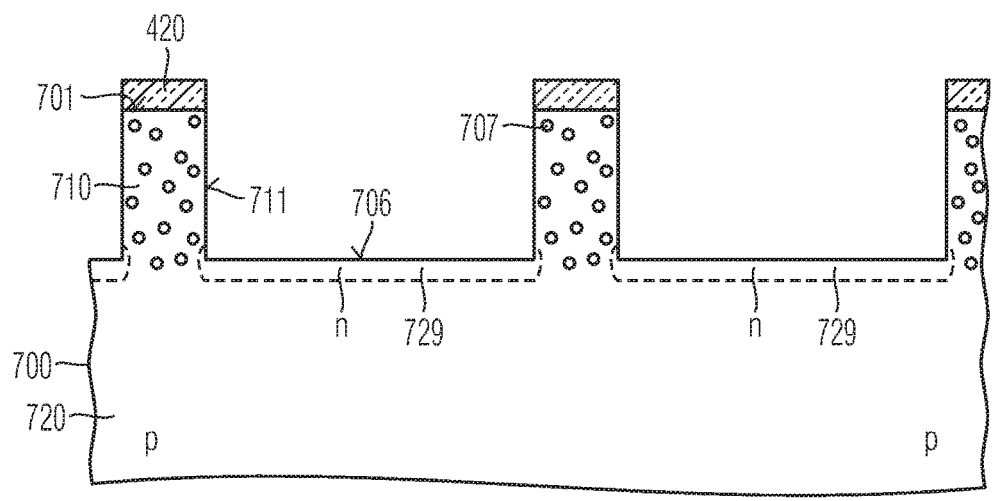
FIG. 9C is a schematic vertical cross-sectional view of the semiconductor substrate portion of FIG. 9B, after increasing porosity of the matrix section.

As illustrated in FIG. 9C the solution forms pores 707 with a diameter up to 200 nm selectively in the p-type matrix section 710 and leaves the passivation regions 729 unaffected. The passivation regions 729 are porous but crystalline such that a second semiconductor material 750 deposited in the epitaxy troughs 705 grows with high crystal quality on the bottom 706 and on the rib sidewalls 711.

Figure 9D:
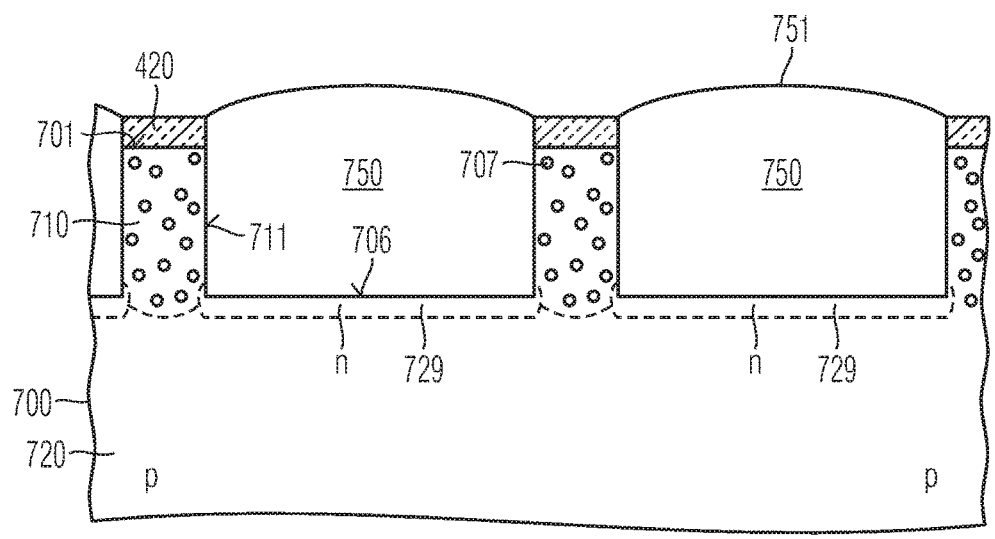
FIG. 9D is a schematic vertical cross-sectional view of the semiconductor substrate portion of FIG. 9C, after epitaxy.

FIG. 9D shows the second semiconductor material 750 partially overgrowing the epitaxy mask 420. A planarizing process planarizes the epitaxy surface 751 of the second semiconductor material 750 to form, in each epitaxy trough 705 of FIG. 9C, one epitaxy region 760 with a planar surface 761. In each epitaxy region 760 one semiconductor body 100 or at least a main body portion of one semiconductor body 100 of a semiconductor device is formed as described above, wherein the planar surface 761 defines a first surface 101 of the semiconductor bodies 100. An interlayer dielectric and a first metallization 360 partially separated from the semiconductor body 100 by the interlayer dielectric may be formed at the front side of the semiconductor bodies 100.

Figure 9E:
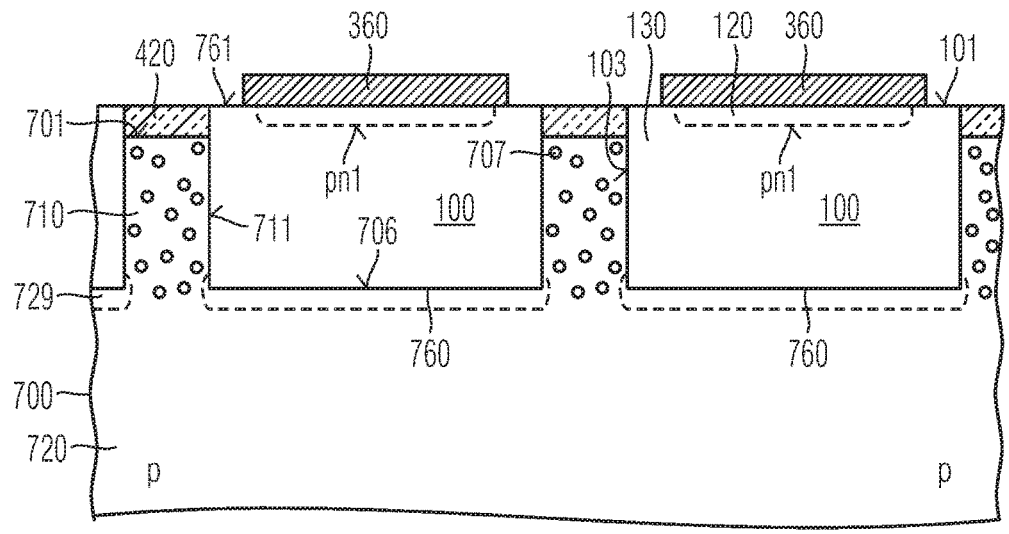
FIG. 9E is a schematic vertical cross-sectional view of the semiconductor substrate portion of FIG. 9D, after forming a front side metallization.

FIG. 9E schematically shows the first metallization 360 at the front side defined by the first surface 101 of the semiconductor bodies 100. The semiconductor bodies 100 may include an anode/body well 120 forming a first pn junction pn1 with a main structure 130, transistor cells, and compensation structures, by way of example. A stiff carrier member 810 e.g., a grinding tape, is reversibly attached at the front side of the semiconductor bodies 100, for example, by adhesion on the first metallization 360.

Figure 9F:
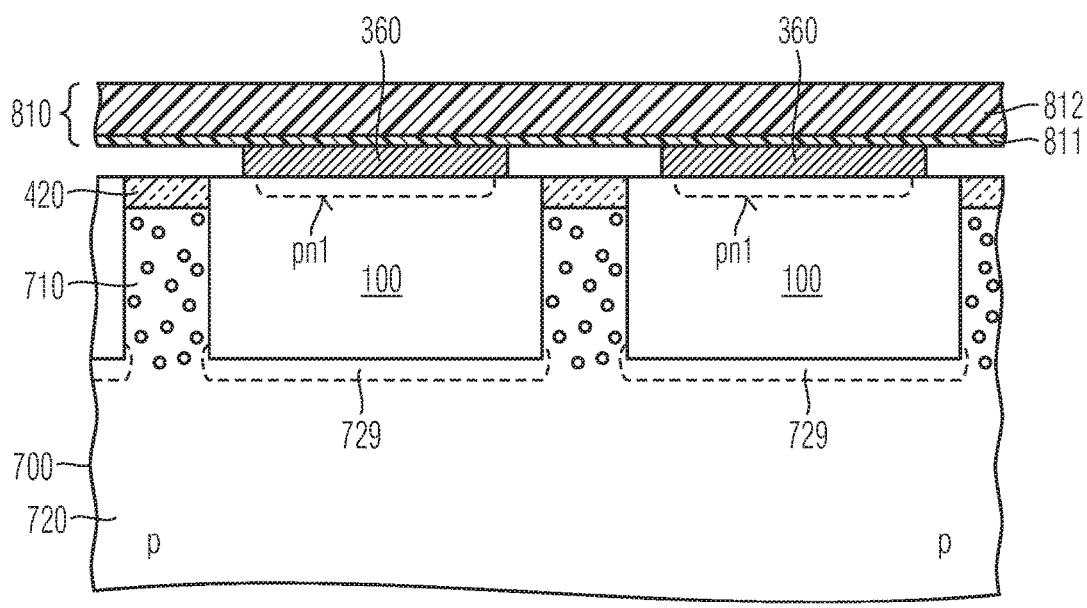
FIG. 9F is a schematic vertical cross-sectional view of the semiconductor substrate portion of FIG. 9E, after attaching a grinding tape at the front side of the semiconductor substrate.

In FIG. 9F, the carrier member 810 may be a glass carrier. According to an embodiment the carrier member 810 includes a rigid, non-stretching film, for example, a temporary bonding adhesive tape including a PET/LCP (polyethylenterephthalat/liquid crystal polymer) base film 812 and a radiation or thermal release adhesive film 811 for reversibly adhering the base film 812 to the first metallization 360.

Starting from the back of the semiconductor substrate 700 opposite to the carrier member 810, a grinding process may remove a portion of the base section 720. For example, a grinding wheel grinds the semiconductor substrate 700 from the back.

The grinding process may stop after detection of the pn junction at the bottom of the passivation regions 729. According to other embodiments, an auxiliary material, e.g., oxygen may be implanted through the bottom 706 of the epitaxy troughs 706 before, after or instead of the implant for the passivation regions 729 to form a layer of increased mechanical strength effective as stopping layer for the grinding.

Figure 9G:
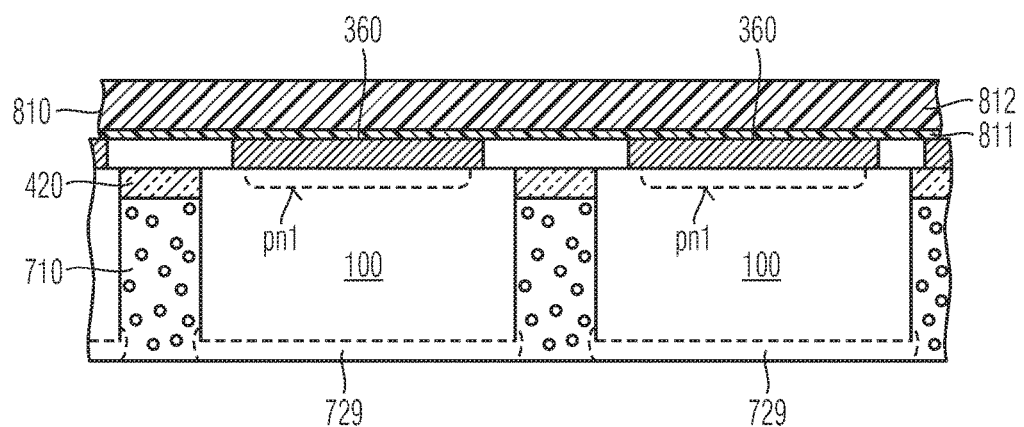
FIG. 9G is a schematic vertical cross-sectional view of the semiconductor substrate portion of FIG. 9F, after thinning the semiconductor substrate from the back.

FIG. 9G shows the passivation regions 729 exposed by grinding. Rear side processes may be applied to define a second surface 102 of the semiconductor bodies 100 opposite to the first surface 101, for example, by removing a portion of the exposed passivation regions 729 or by removing completely the passivation regions 729. Further processes may form further doped regions in the passivation regions 729 or in portions of the semiconductor bodies 100 accessible through the bottom of the epitaxy region 760.

The porous first semiconductor material of the matrix section 710 may be removed, e.g., by an etching process that selectively removes semiconductor material of high porosity against semiconductor material of low porosity. Alternatively, hydrogen may be introduced into the matrix section 710 at a suitable temperature at which the pores in the matrix section 710 rearrange and the mechanical strength of the ribs of the matrix section 710 drastically decreases.

Figure 9H:
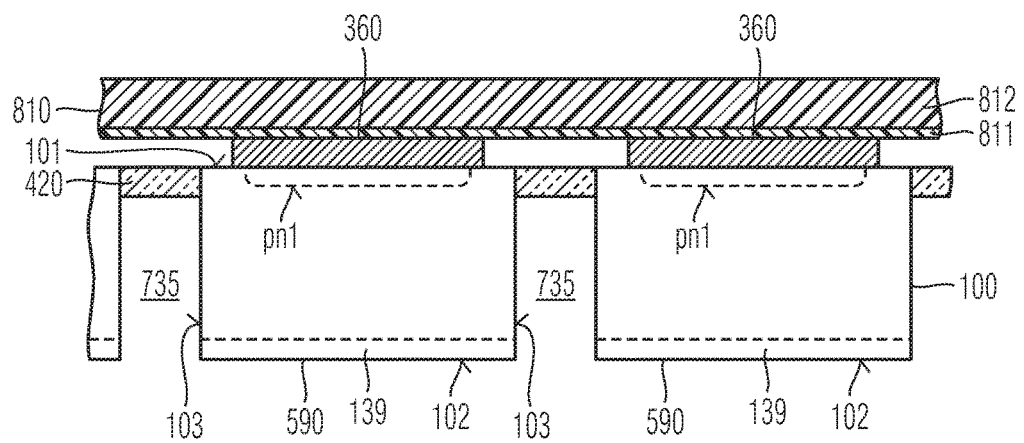
FIG. 9H is a schematic vertical cross-sectional view of the semiconductor die composite obtained from the semiconductor substrate portion of FIG. 9G by selectively removing the matrix section.

FIG. 9H shows a composite of semiconductor dies 590 arranged matrix-like in lines and columns on the carrier member 810. Each semiconductor die 590 includes one semiconductor body 100 with a first metallization 360. At least portions of the passivation regions 729 may form doped regions of the semiconductor bodies 100, e.g., a field stop layer, or, as illustrated, a heavily doped electrode/emitter layer 139. In this way, the semiconductor dies 590 are physically separated by a process that does not damage lateral surfaces 103 of the semiconductor bodies 100. Removal of the ribs of the matrix section 710 leaves dicing grooves 735 exposing the lateral surfaces 103 of the semiconductor bodies 100. The dicing grooves 735 maybe filled with a sacrificial material 820, e.g., by a stencil print process, and a second metallization layer 371 may be formed on the back of the semiconductor dies 590.

Figure 9I:
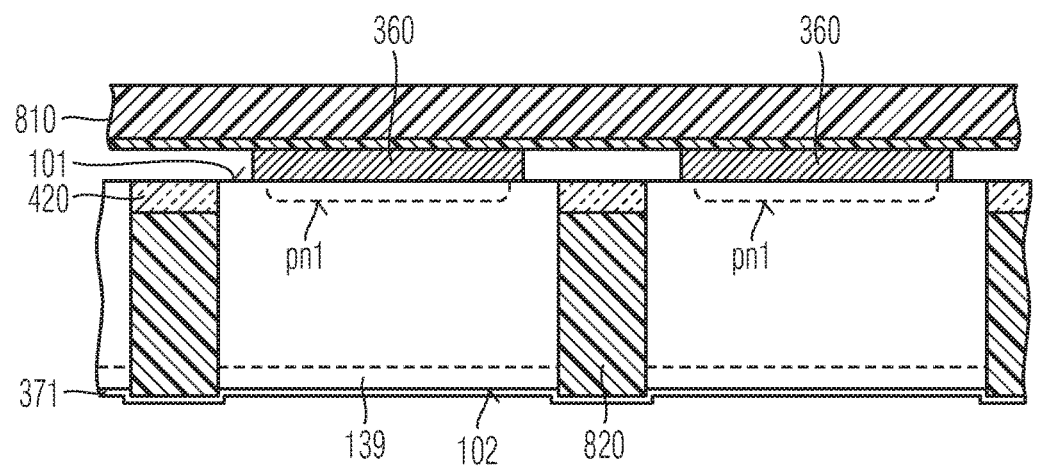
FIG. 9I is a schematic vertical cross-sectional view of the semiconductor die composite of FIG. 9H, after forming a second metallization at a rear side.

FIG. 9I shows the second metallization layer 371 covering the sacrificial material 820 and the second surfaces 102 of the semiconductor bodies 100.

From the second metallization layer 371 a patterning process may form a second metallization 370 including second electrode structure on the semiconductor bodies 100. The sacrificial material 820 and, if applicable, remnants of the epitaxy mask 420 are removed.

Figure 9J:
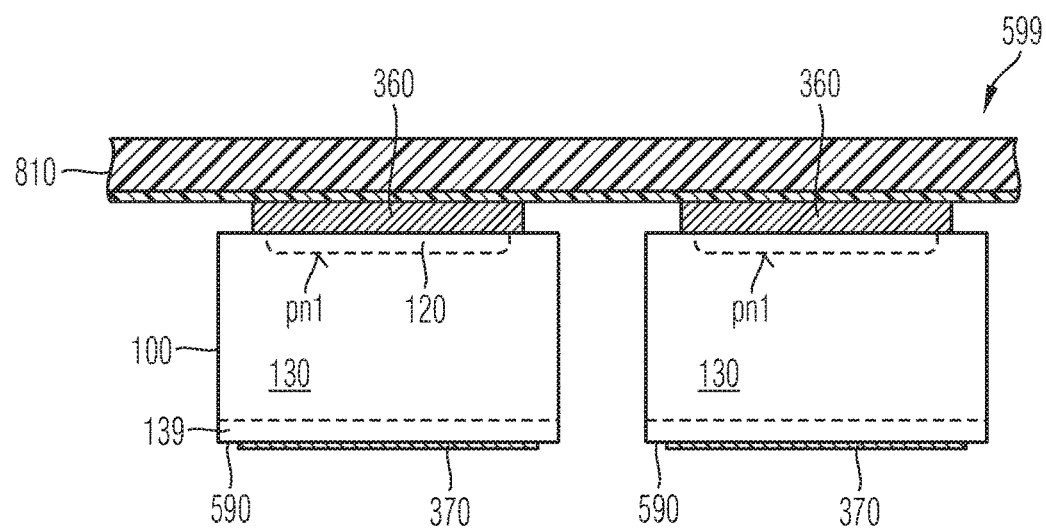
FIG. 9J is a schematic vertical cross-sectional view of the semiconductor die composite of FIG. 9I, after removing a sacrificial material.

FIG. 9J shows a semiconductor die composite 599 including isolated semiconductor dies 590 attached on a carrier member 810. A stretchable pick-up tape may be attached to the second metallization 370 and the carrier member 810 may be removed from the front side.

Figure 10A:
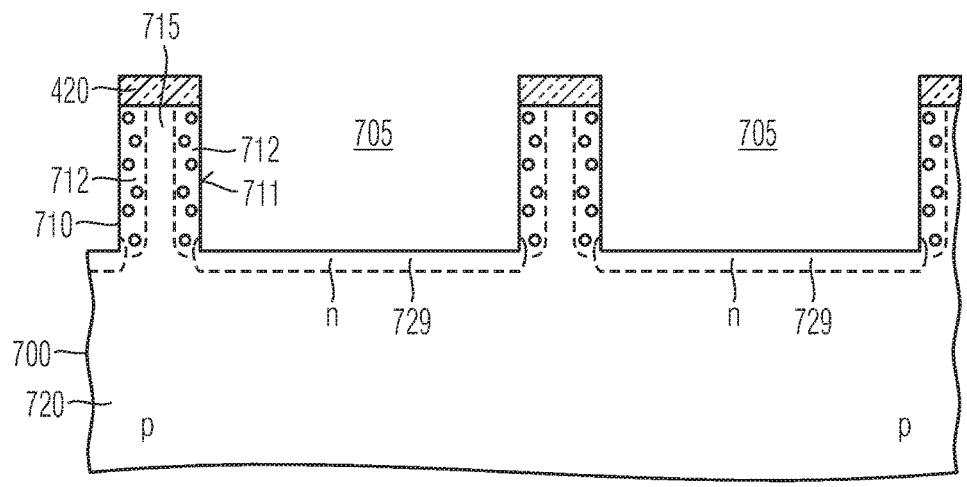
FIG. 10A is a schematic vertical cross-sectional view of a semiconductor substrate portion for illustrating a method of manufacturing semiconductor devices according to an embodiment increasing porosity selectively in rib sidewall sections, after increasing porosity.

In FIG. 10A, instead of increasing porosity in the complete cross-section of the ribs of the matrix section 710, a pretreatment increases the porosity only in rib sidewall sections 712 along the rib sidewalls 711, wherein central rib sections 715 are left unaffected and may have the same porosity as the base section 720.

Figure 10B:
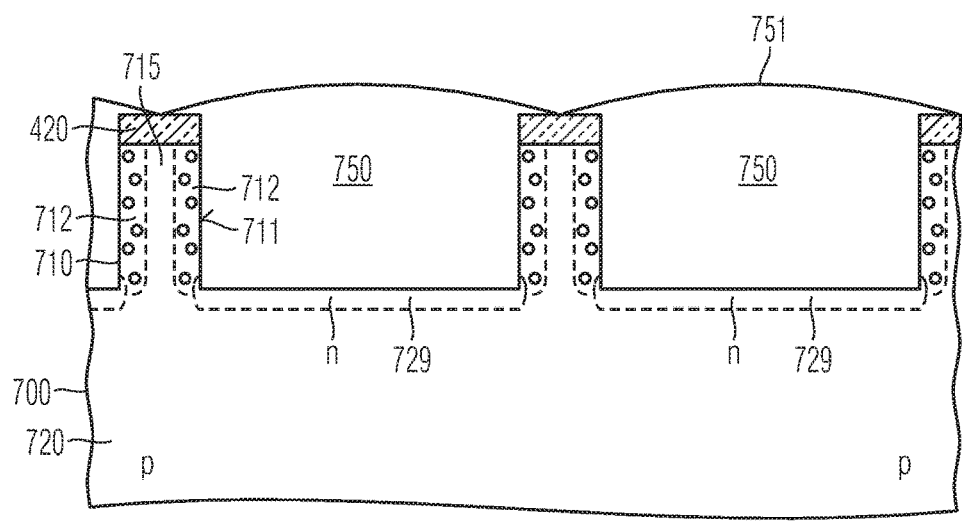
FIG. 10B is a schematic vertical cross-sectional view of the semiconductor substrate portion of FIG. 10A, after epitaxy.

FIG. 10B shows second semiconductor material 750 that may partially overgrow the epitaxy mask 420. The process may proceed as illustrated in FIGS. 9E to 9J, wherein the central rib section 715 may be removed before or after the sacrificial material 820 fills the dicing grooves 735 of FIG. 9H.

Figure 11A:
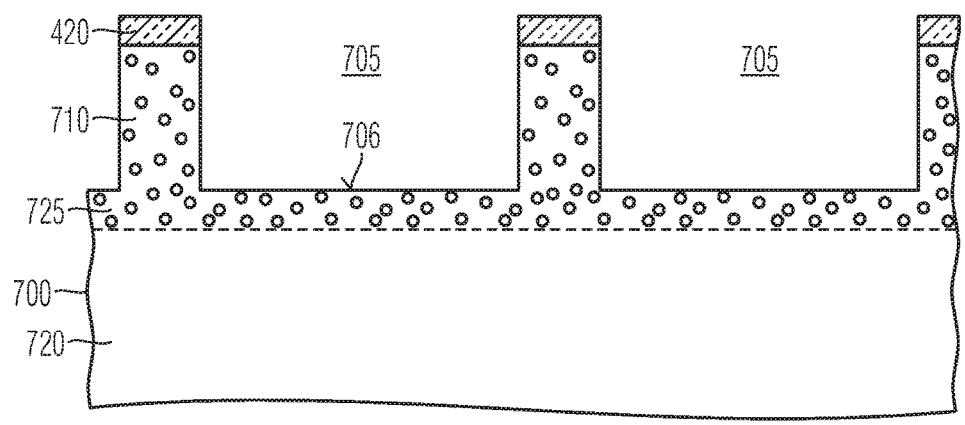
FIG. 11A is a schematic vertical cross-sectional view of a semiconductor substrate portion for illustrating a method of manufacturing semiconductor devices according to an embodiment using increased porosity for splitting off semiconductor bodies from a continuous base substrate, after forming a porous layer below epitaxy troughs.
Figure 11B:
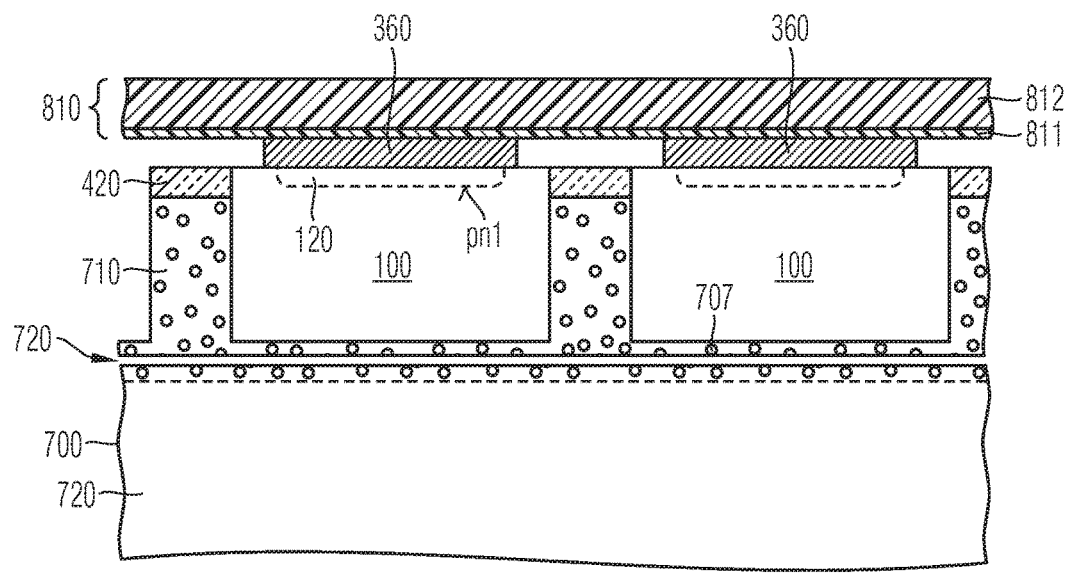
FIG. 11B is a schematic vertical cross-sectional view of the semiconductor substrate portion of FIG. 11A, after forming, by epitaxy, epitaxy regions in the epitaxy troughs.

FIGS. 11A to 11B refer to a method increasing porosity not only in the matrix section 710 but also in a portion of the base section 720 directly below the epitaxy troughs 705.

FIG. 11A shows a horizontal porous layer 725 formed in a section of the base section 720 directly adjoining the epitaxy troughs 705. Apart from the pores 707, the crystal lattice of the semiconductor material in the porous layer 725 and the matrix section 710 is intact, and a crystalline second semiconductor material 750 grows on the bottom 706 of the epitaxy troughs 705 at high crystal quality. The processing may proceed as described with regard to FIGS. 9E and 9F.

Then a first portion of the semiconductor substrate 700 including the matrix section 710 and the semiconductor bodies 100 is separated from the base section 720 along the porous layer 725. For example, hydrogen may be applied at a temperature at which the pores rearrange. For example, a hydrogen beam is directed to the porous layer 725. The pores 707 in the porous layer 725 rearrange along a plane within the porous layer 725 such that a first portion of the semiconductor substrate 700 including the matrix section 710 and the semiconductor bodies 100 splits off from a second portion of the base section 720 below the porous layer 725 as illustrated in FIG. 11B.

The method illustrated in FIGS. 12A to 12D uses an n-type doped layer 728 as an etch stop for an electrochemical etching of a p-type base section 720.

Epitaxy troughs 705 are formed in a semiconductor substrate 700 as described above. After forming an epitaxy mask 420, e.g., by removing undercut portions of an etch mask, donor atoms are implanted through the bottom 706 of the epitaxy troughs 705.

Figure 12A:
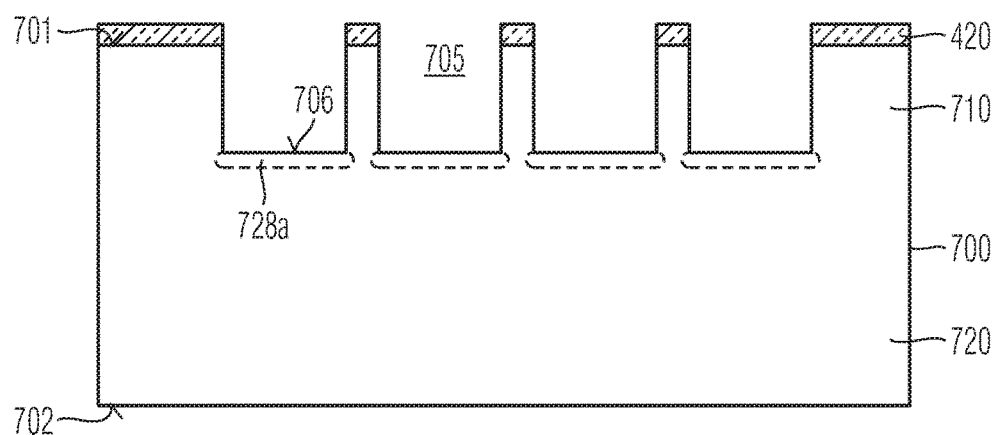
FIG. 12A is a schematic vertical cross-sectional view of a semiconductor substrate for illustrating a method of manufacturing semiconductor devices according to an embodiment using electrochemical etching, after forming horizontal n-type regions below epitaxy troughs.

FIG. 12A shows implant regions 728a including donors in the vertical projection of the epitaxy troughs 705. Epitaxy regions 760 with planar surfaces 761 are formed in the epitaxy troughs 705 as described above. In each epitaxy region 760 a semiconductor body 100 of a semiconductor device is formed by a sequence of implant, deposition, etching and patterning processes.

Figure 12B:
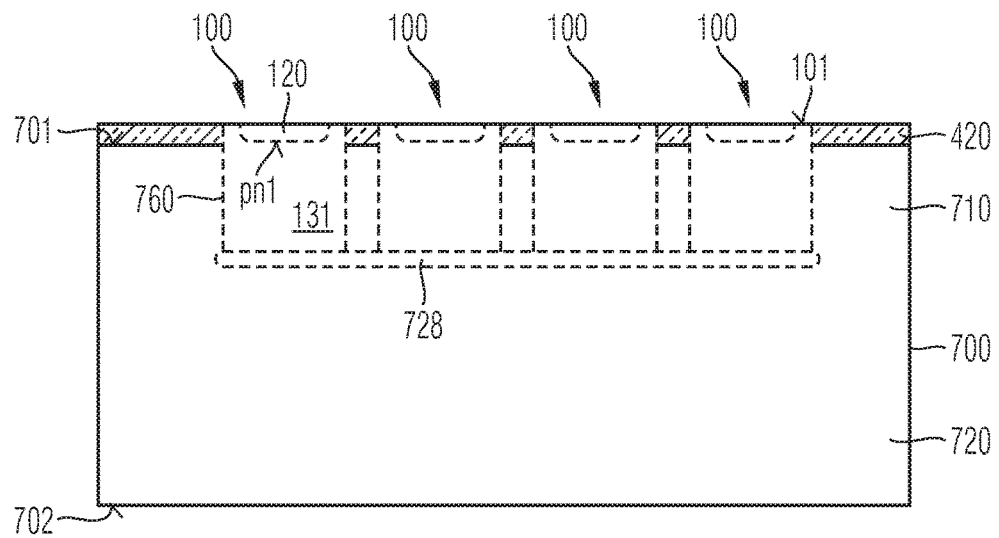
FIG. 12B is a schematic vertical cross-sectional view of the semiconductor substrate of FIG. 12A, after for epitaxy regions in the epitaxy troughs.

FIG. 12B shows semiconductor bodies 100 formed in the epitaxy regions 760, wherein the semiconductor bodies 100 may include anode/body wells 120 forming first pn junctions pn1 with a main structure that may include a lightly doped drift zone 131. The implant regions 728a may diffuse to a certain degree and may form a continuous horizontal doped layer 728.

A metal electrode 831, which may be an un-patterned first metallization layer, from which the first metallization at the front side of the semiconductor bodies 100 is formed, may be deposited on the process surface 701 of the semiconductor substrate 700. A hard mask layer is deposited on a support surface 702 of the semiconductor substrate 700 opposite to the process surface 701. The hard mask layer may be patterned by lithography to form a rear side mask 490 with an opening 491 in the vertical projection of a central section of the semiconductor substrate 700, wherein the central section includes the semiconductor bodies 100.

Figure 12C:
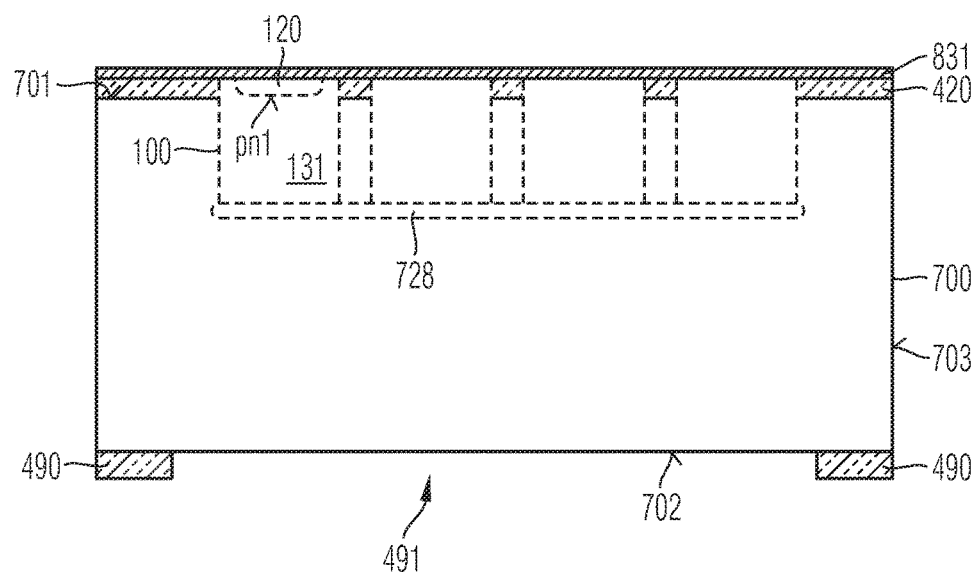
FIG. 12C is a schematic vertical cross-sectional view of the semiconductor substrate of FIG. 12B, after forming a rear side mask.

FIG. 12C shows the rear side mask 490 that may directly adjoin an outer surface 703 of the semiconductor substrate 700.

The semiconductor substrate 700 is immersed in an electrochemical solution 835 in a process chamber 839 that contains a cathode 832. The cathode 832 is arranged at the rear side of the semiconductor substrate 700 opposite to the metal electrode 831. The metal electrode 831 is electrically connected to a positive potential and is effective as anode. The cathode 832 is electrically connected to a negative potential. The electrochemical etch of the base section 720 in the vertical projection of the opening 491 in the rear side mask 490 stops at the pn junction formed between the p-type base section 720 and the horizontal n-type doped layer 728.

Figure 12D:
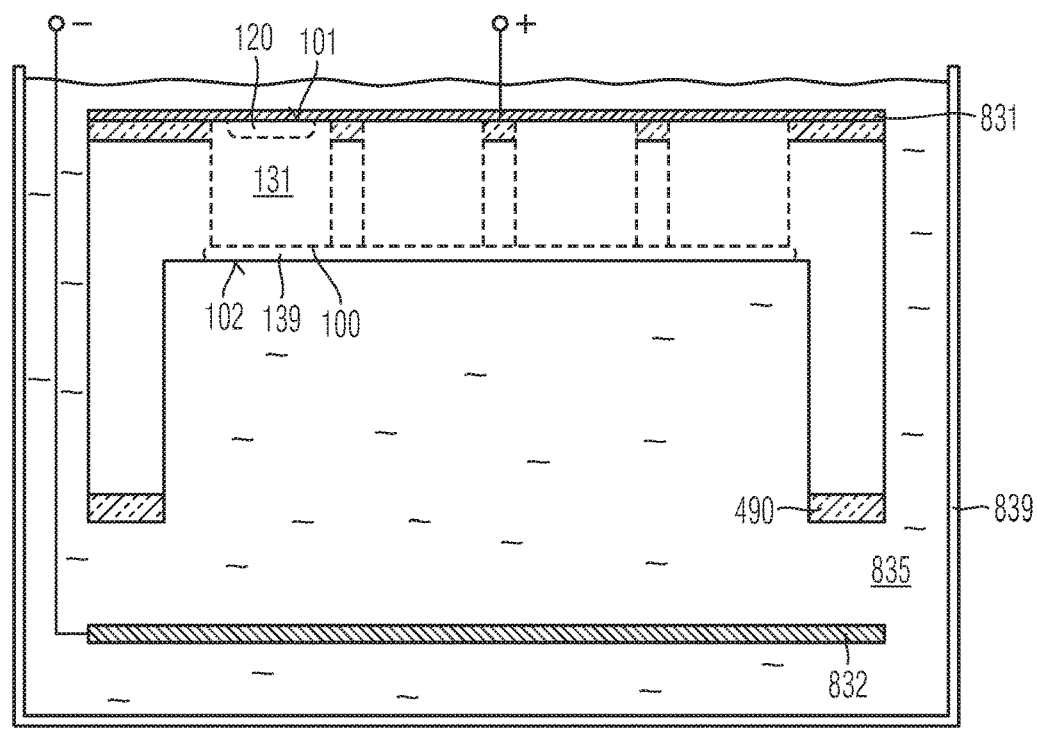
FIG. 12D is a schematic vertical cross-sectional view of the semiconductor substrate of FIG. 12C during an electrochemical etch using the rear side mask as etch mask.

As illustrated in FIG. 12D, the semiconductor body 100 may include at least a portion of the horizontal n-type doped layer 728 as a horizontal field stop layer with a higher dopant concentration than the drift zone 131 or as an electrode/emitter layer 139.

FIGS. 13A to 13D refer to a DBG (dicing before grinding) process that firstly incompletely dices a wafer by forming dicing grooves 735 separating neighboring semiconductor bodies 100, and then completely separating the semiconductor bodies 100 by grinding a semiconductor substrate 700 from the rear to expose the dicing grooves 735.

Semiconductor bodies 100 of semiconductor devices are formed in epitaxy regions obtained by filling epitaxy troughs as described with reference to FIGS. 9A to 9E, by way of example. After forming the first metallization 360 at the front side, the epitaxy mask 420 as well as the ribs of the matrix section 710 are removed to form dicing grooves 735.

Figure 13A:
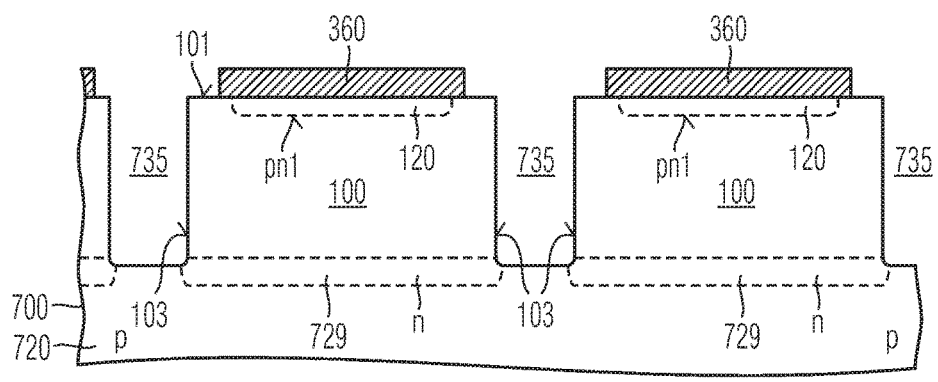
FIG. 13A is a schematic vertical cross-sectional view of a semiconductor die composite for illustrating a method of manufacturing semiconductor devices according to an embodiment concerning a DBG (dicing before grinding) process, after selectively removing a porous matrix section of a semiconductor substrate.

FIG. 13A shows the dicing grooves 735 separating neighboring semiconductor bodies 100 and exposing lateral surfaces 103 of the semiconductor bodies 100.

According to FIG. 13B a rigid carrier member 810 is applied on the first metallization 360 at the front side as described with reference to FIG. 9F. A grinding or polishing process removes the base section 720 and exposes the dicing grooves 735. The dicing grooves 735 may be filled with a sacrificial material 820, e.g., a polymer. Alternatively, a thin sidewall passivation may protect the exposed lateral surfaces 103 of the semiconductor bodies 100 during processes applied to the rear side of the semiconductor bodies 100 such as implants and deposition of metal layers.

Figure 13B:
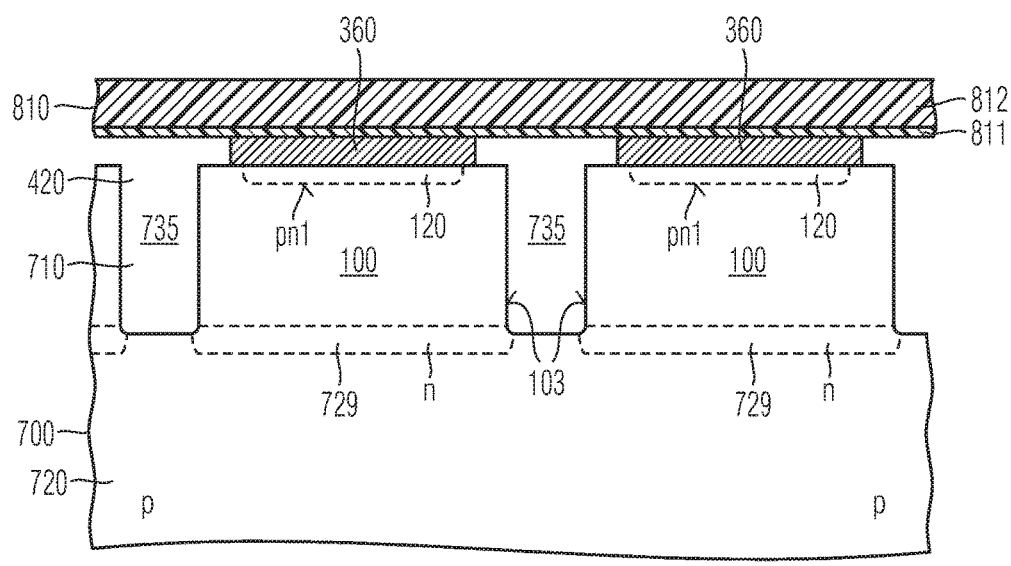
FIG. 13B is a schematic vertical cross-sectional view of the semiconductor die composite of FIG. 13A, after attaching a grinding tape at the front side.
Figure 13C:
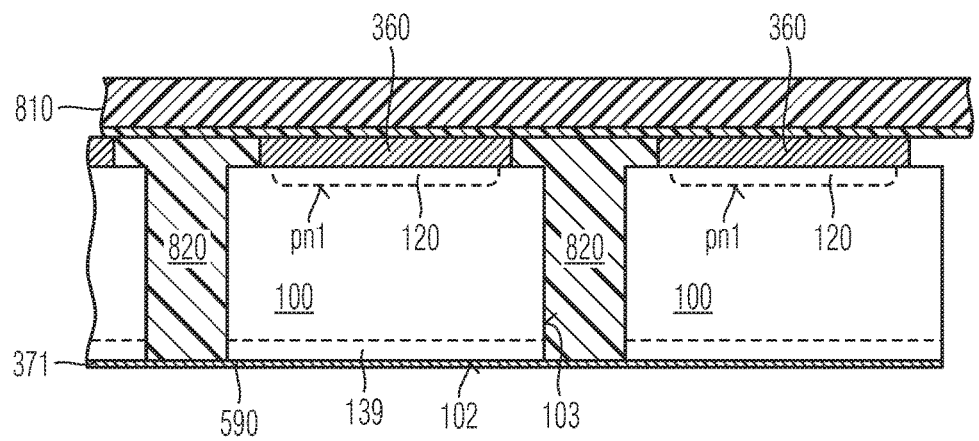
FIG. 13C is a schematic vertical cross-sectional view of the semiconductor die composite of FIG. 13B, after forming a second metallization on the back.

FIG. 13C shows the sacrificial material 820 filling the dicing grooves 735 of FIG. 13B. A continuous second metallization layer 371 covers the second surfaces 102 on the back of the semiconductor bodies 100, which may include at least portions of the passivation regions 729 of FIG. 13B, e.g., as electrode/emitter layer 139. The second metallization layer 371 on the rear side may be patterned and the sacrificial material 820 may be removed.

Figure 13D:
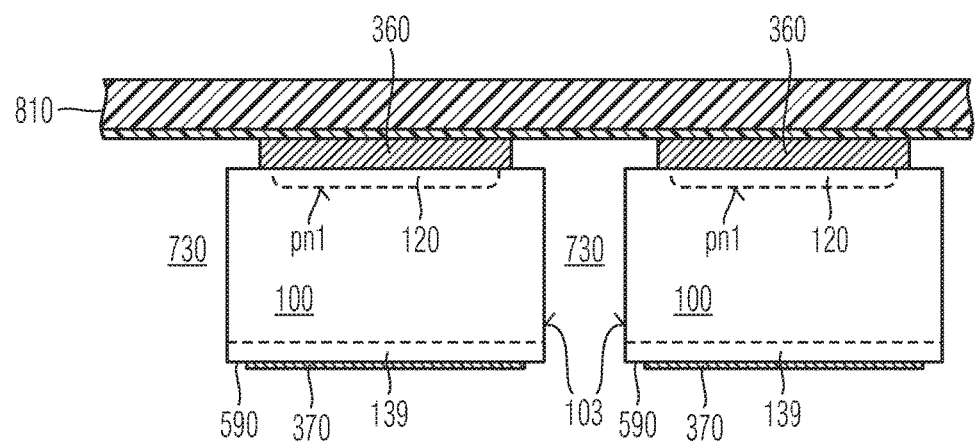
FIG. 13D is a schematic vertical cross-sectional view of the semiconductor die composite of FIG. 13C, after removing a sacrificial material.

FIG. 13D shows isolated semiconductor dies 590 arranged in lines and columns on a carrier member 810. Each semiconductor die 590 includes a semiconductor body 100 with a first metallization 360 at a front side and a second metallization 370 on the back.

FIGS. 14A to 14F concern an embodiment combining formation of the epitaxy troughs 705 with formation of a grid-shaped separation trench 735 in the matrix section 710.

Figure 14A:
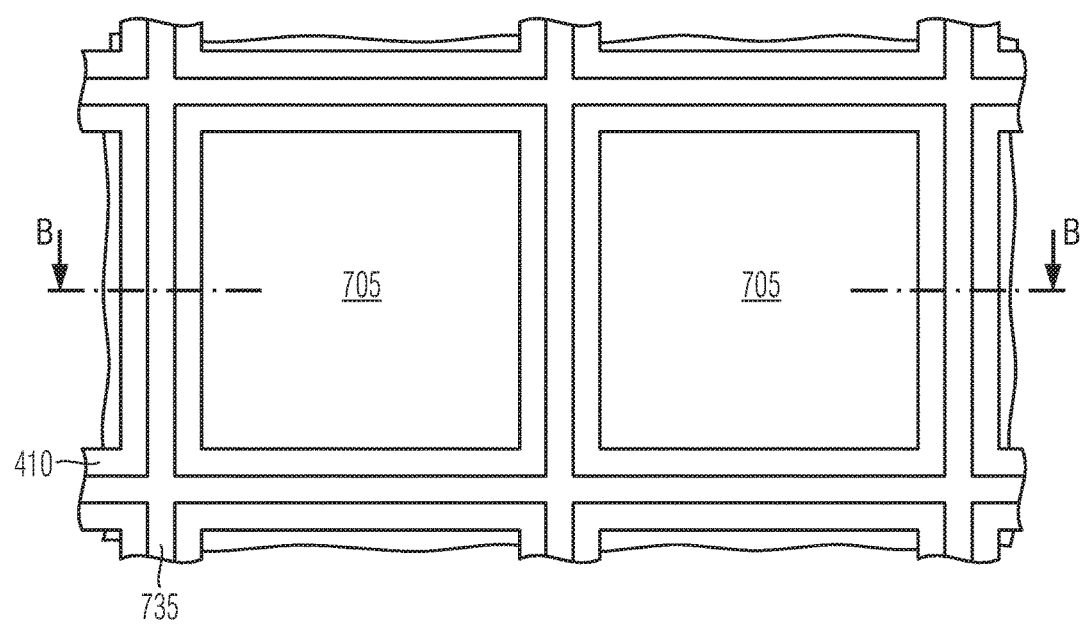
FIG. 14A is a schematic plan view of a semiconductor substrate portion for illustrating a method of manufacturing semiconductor devices according to an embodiment concerning formation of epitaxy troughs and a grid-like separation trench.

As shown in FIG. 14A a separation trench 735 and the epitaxy troughs 705 may be defined through the same etch mask 410. The separation trench 735 forms a regular grid with rectangular meshes, wherein each mesh includes an epitaxy trough 705.

Figure 14B:
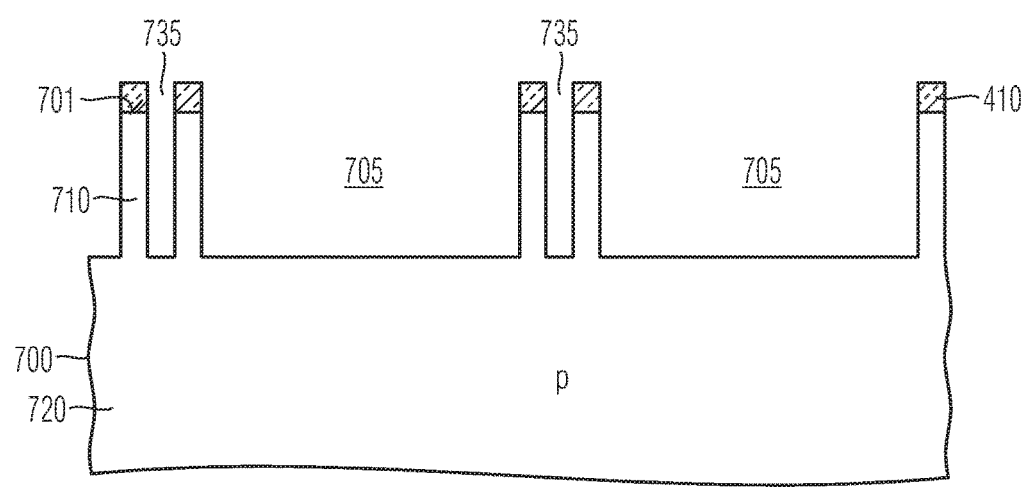
FIG. 14B is a schematic vertical cross-sectional view of the semiconductor substrate portion of FIG. 14A.

According to FIG. 14B a vertical extension of the separation trench 735 is approximately the same as a vertical extension of the epitaxy troughs 705. According to other embodiments, the separation trench 735 may be shallower or deeper than the epitaxy troughs 705. Before epitaxy in the epitaxy troughs 705, the separation trench 735 is masked against epitaxial growth. According to an embodiment, a heat treatment in an atmosphere containing hydrogen may selectively close the separation trench 735 and may leave approximately unaffected the epitaxy troughs 705. According to another embodiment, an auxiliary layer may be formed that selectively covers the opening of the separation trench 735 and leaves open the epitaxy troughs 705.

Figure 14C:
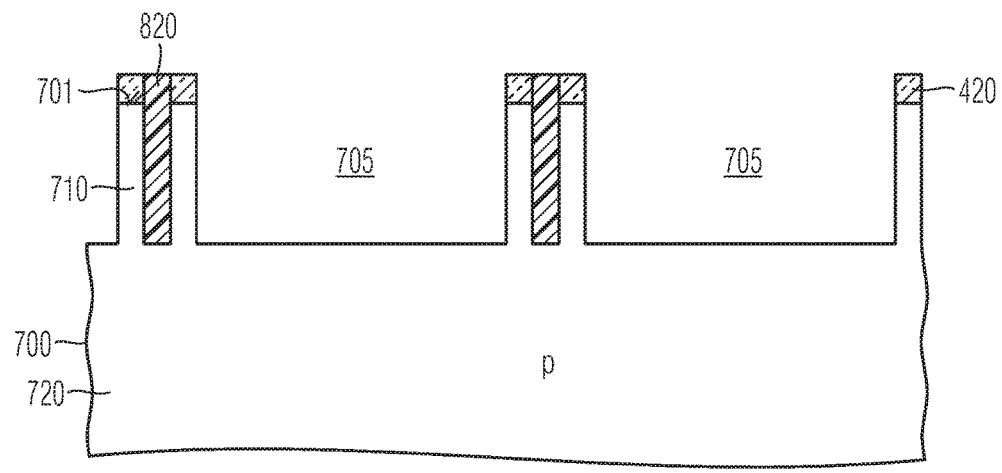
FIG. 14C is a schematic vertical cross-sectional view of the semiconductor substrate portion of FIG. 14B, after masking the separation trench.

FIG. 14C refers to temporary fill of the separation trench 735 with a plug structure of a sacrificial material 820. The plug structure of sacrificial material 820 may be formed, e.g., by a conformal deposition followed by an isotropic etch that removes portions of the sacrificial material 820 deposited outside the separation trench 735.

FIG. 14C shows the sacrificial material 820 forming the plug structure in the separation trench 735. The sacrificial material 820 may be any material with sufficient etch selectivity against the material of the matrix section 710 and with suitable deposition properties. For example, the sacrificial material 820 may be a silicon oxide, carbon, a resist material, or a combination of different layers.

Figure 14D:
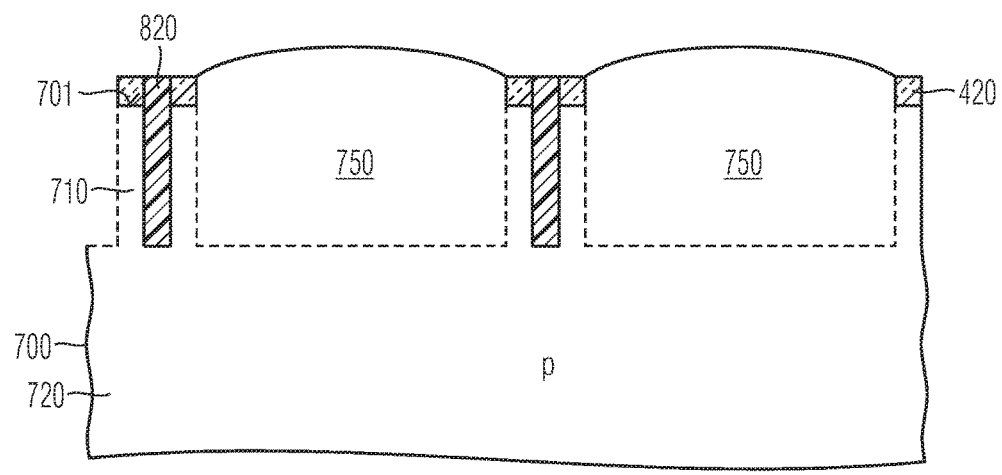
FIG. 14D is a schematic vertical cross-sectional view of the semiconductor substrate portion of FIG. 14C, after epitaxy.

FIG. 14D shows the semiconductor substrate 700 after epitaxy, wherein an epitaxy mask 420 may include sections of the etch mask 410 of FIG. 14B and the sacrificial material 820 in the separation trench 735. The epitaxy grows a second semiconductor material 750 in registry with the crystal lattice of the semiconductor substrate 700. The process may proceed with planarization of the second semiconductor material 750 and with formation of semiconductor elements in semiconductor bodies 100 obtained from the second semiconductor material 750 and from remnant portions of the matrix section 710 as described above.

Figure 14E:
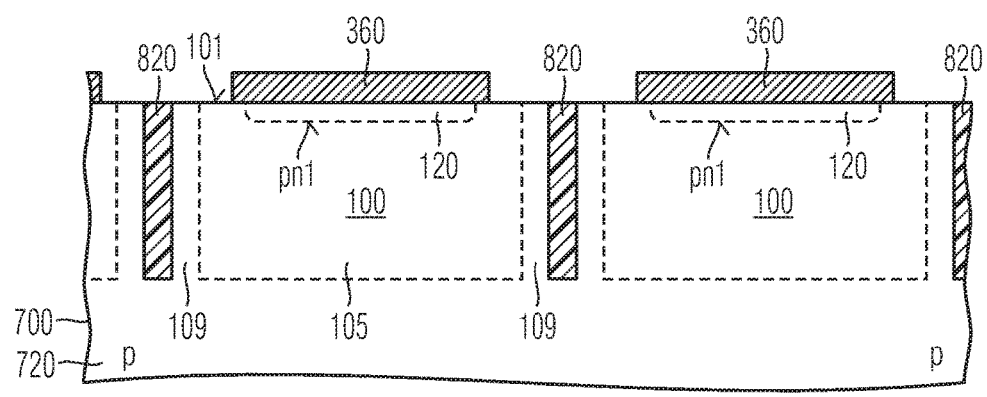
FIG. 14E is a schematic vertical cross-sectional view of the semiconductor substrate portion of FIG. 14D, after forming a first metallization.

FIG. 14E shows a plurality of semiconductor bodies 100 after forming a first metallization 360 at a front side. A rigid carrier member 810 may be attached to the first metallization 360 before the substrate 700 is thinned from the side opposite to the first metallization 360. Further processes may be applied to the exposed rear side.

Figure 14F:
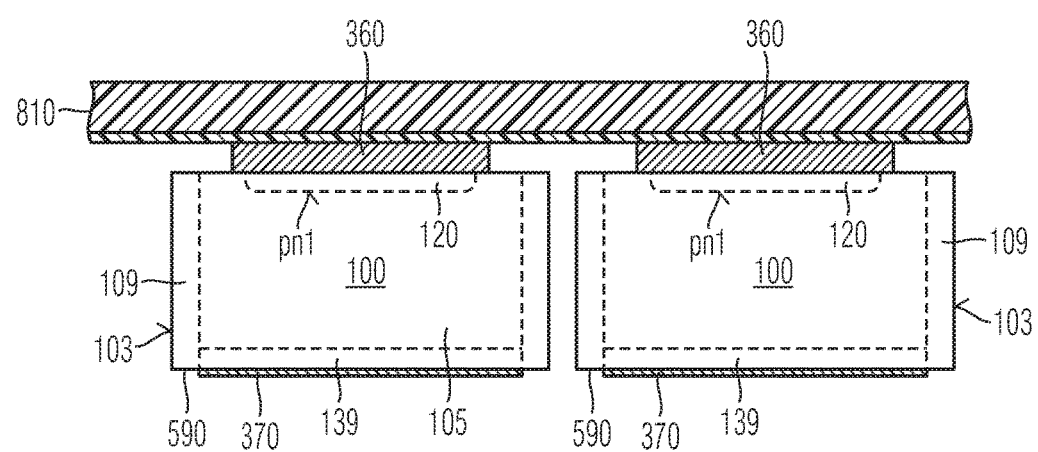
FIG. 14F is a schematic vertical cross-sectional view of the semiconductor substrate portion of FIG. 14E, after dicing.

FIG. 14F shows an electrode/emitter layer 139 formed, e.g., by implantation. Before or after forming a second metallization 370, the sacrificial material 820 is removed to separate isolated semiconductor dies 590. The semiconductor body 100 of each semiconductor die 590 includes a main body portion 105 from the second semiconductor material and a lateral body portion 109 from remnant portions of the matrix section 710 of FIG. 14D, wherein the lateral body portion 109 horizontally encloses the main body portion 105 on all sides.

FIGS. 15A to 15D refer to the formation of a lateral channel stopper using epitaxial growth in epitaxy troughs, wherein the epitaxy troughs are used to form an anode/body well forming a lateral pn junction with the channel stopper.

A semiconductor substrate 700 may be formed on the basis of a heavily doped base portion 721, which may be a heavily doped n-type substrate or a heavily doped epitaxial layer grown on an arbitrarily doped base substrate. A lightly doped n-type drift portion 722 is formed on the heavily doped n-type base portion 721. An n-type channel stop portion 717 with a dopant concentration exceeding at least ten times a mean net dopant concentration in the drift portion 722 is grown on the drift portion 722.

Figure 15A:
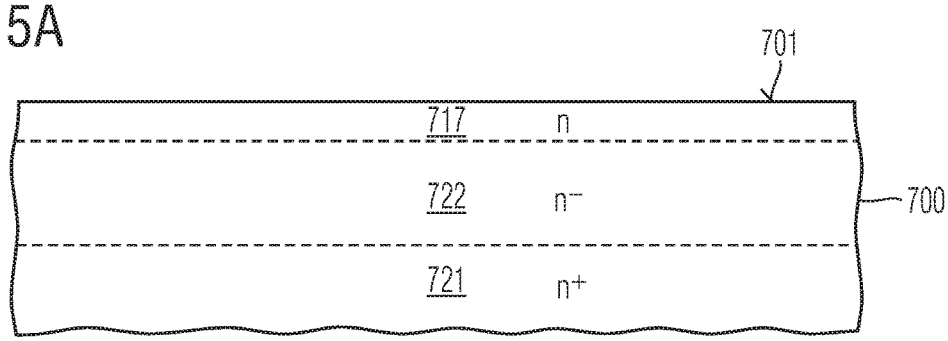
FIG. 15A is a schematic vertical cross-sectional view of a portion of a semiconductor substrate for illustrating a method of manufacturing semiconductor devices according to an embodiment including epitaxial growth of an anode/body well, after forming a channel stop layer.

FIG. 15A shows the lightly doped n-type drift portion 722 sandwiched between the n-type channel stop portion 717 and the heavily doped n-type base portion 721. The channel stop portion 717 is from a crystalline first semiconductor material, which may be an n-doped silicon crystal with a donor concentration higher than in the drift portion 722. Epitaxy troughs 705 are etched into the channel stop portion 717. In addition, dicing grooves 735 may be etched into a process surface 701 of the channel stop portion 717, wherein the dicing grooves 735 form a grid with the epitaxy troughs 705 arranged in the meshes of the grid.

Figure 15B:
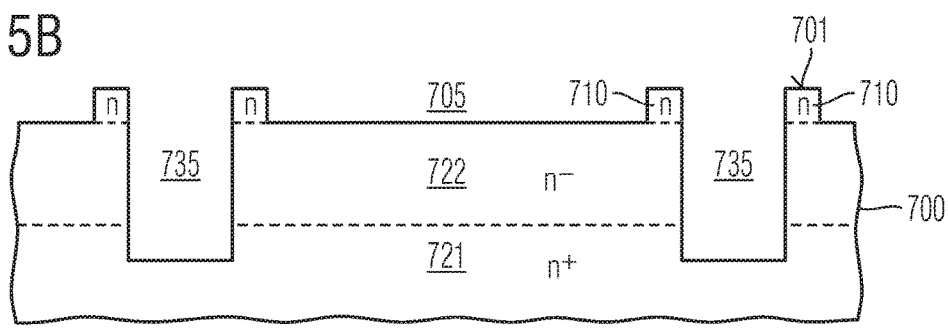
FIG. 15B is a schematic vertical cross-sectional view of the semiconductor substrate portion of FIG. 15A, after forming epitaxy troughs and dicing grooves.

According to FIG. 15B, the epitaxy troughs 705 extend through the channel stop portion 717 of FIG. 15A and expose the drift portion 722. The dicing grooves 735 cut through the channel stop portion 717 and through the drift portion 722 and may extend into the heavily doped base portion 721. In each mesh of the grid, a remnant portion of the channel stop portion 717 forms a matrix section 710 surrounding the epitaxy troughs 705, respectively.

An epitaxy mask may be formed that suppresses epitaxial growth in at least the dicing grooves 735 and, if applicable, on the remnant portion of the channel stop portion 717. The epitaxy mask may include remnants of an etch mask defining the epitaxy troughs 705. Then, a crystalline second semiconductor material 750 is deposited that forms an epitaxial layer in the epitaxy troughs 705 as described above.

Figure 15C:
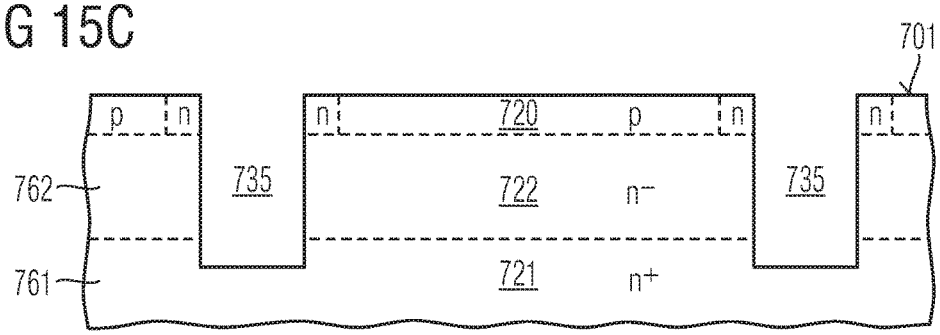
FIG. 15C is a schematic vertical cross-sectional view of the semiconductor substrate portion of FIG. 15B, after forming an epitaxial region in the epitaxy troughs.

FIG. 15C shows the second semiconductor material 750 formed in the epitaxy troughs 705 of FIG. 15B. The crystalline second semiconductor material 750 has the complementary conductivity type of the crystalline first semiconductor material. A sequence of implant, etching, deposition and patterning processes may form further structures of semiconductor devices in the semiconductor bodies 100 defined in the meshes of the grid formed by the dicing grooves 735.

A separation process may include depositing a sacrificial material in the dicing grooves 735 and attaching a carrier member at a front side defined by the process surface 701 of the semiconductor substrate 700. A grinding process removes material of the heavily doped base portion 721 starting from a supporting surface opposite to the process surface 701. The grinding may stop after exposing the dicing grooves 735. A sacrificial material temporarily filling the dicing grooves 735 may be removed to obtain isolated semiconductor dies 590 including the semiconductor bodies 100 of semiconductor devices.

Figure 15D:
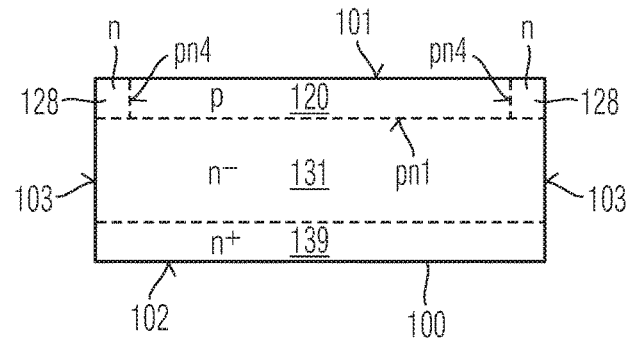
FIG. 15D is a schematic vertical cross-sectional view of a semiconductor body of a semiconductor device obtained from the semiconductor substrate portion of FIG. 15C.

FIG. 15D shows a semiconductor die 590 including a semiconductor body 100 with a first surface 101 defined by the process surface 701 and a second surface 102 opposite to the first surface 101 and exposed by the grinding process. A lateral surface 103 connecting the first and second surfaces 101, 102 is defined by the sidewalls of the dicing grooves 735 of FIG. 15C.

A heavily doped electrode/emitter layer 139 may result from remnants of the heavily doped base portion 721 of FIG. 15C. A section of the drift portion 722 of FIG. 15A forms a drift zone 131 that may form a first pn junction pn1 with an anode/body well 120 from the second semiconductor material 750 of FIG. 15C. Remnants of the channel stop portion 717 along the lateral surface 103 form a lateral channel stopper 128 forming a lateral pn junction pn4 with the anode/body well 120.

Figure 16A:
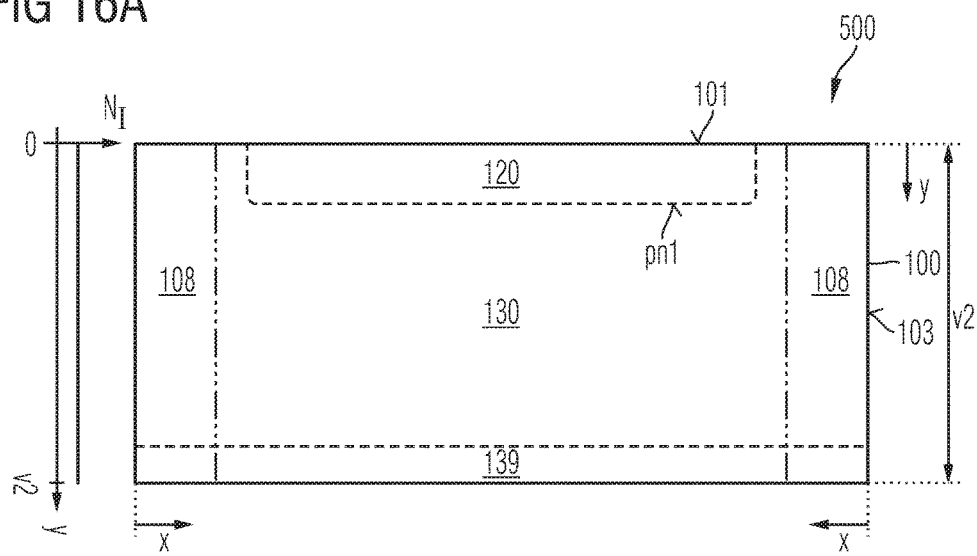
FIG. 16A is a schematic vertical cross-sectional view of a semiconductor device including a lateral structure of uniform width according to an embodiment.
Figure 16B:
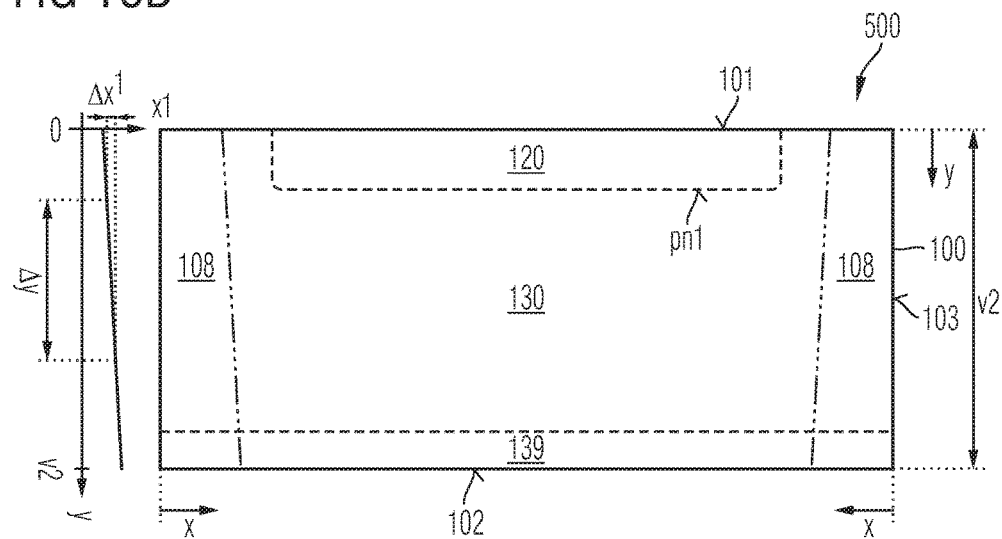
FIG. 16B is a schematic vertical cross-sectional view of a semiconductor device including a lateral structure with a width increasing with increasing distance to the front side according to an embodiment.

FIGS. 16A and 16B refer to semiconductor devices 500 including a semiconductor body 100 of a crystalline semiconductor material such as silicon (Si), germanium (Ge), silicon germanium (SiGe), silicon carbide (SiC) or any AIIIBV semiconductor. The semiconductor body 100 has a planar first surface 101 at a front side and a second surface 102 parallel to the first surface 101 on the back. The semiconductor body 100 includes a doped main structure 130 forming a first pn junction pn1 with an anode/body well 120, which is formed between the first surface 101 and the main structure 130. The main structure 130 includes a doped electrode/emitter layer 139 directly adjoining the second surface 102. A lateral surface 103 connects the first surface 101 and the second surface 102. The lateral surface 103 may be vertical or may include at least a vertical section directly adjoining to the first surface 101.

Directions parallel to the first surface 101 are horizontal directions and a normal to the first surface 101 defines a vertical direction. A horizontal cross-sectional area of the semiconductor body 100 is in a range from 0.5 mm2 to 2 cm$^2$, e.g., in a range from 1 mm$^2$ to 1 cm$^2$. A vertical extension v2 of the semiconductor body 100 may be in a range from 5 μm to 300 μm, for example, in a range from 40 μm to 200 μm or to 140 μm.

The semiconductor device 500 may be a power semiconductor device with a vertical on-state or forward current between the first surface 101 and the second surface 102. For example, the semiconductor device 500 is a power semiconductor diode, an IGFET, an IGBT, a thyristor, a power MOSFET or a semiconductor device including LV (low voltage) circuits, for example, a short-circuit detection circuit or a temperature control circuit, in addition to a HV (high voltage) section including a vertical power semiconductor diode, an IGFET, an IGBT or a thyristor.

The anode/body well 120 may form, by way of example, the anode region of a power semiconductor diode or the body regions of transistor cells electrically connected in parallel, wherein the body regions form second pn junctions with source zones between the first surface 101 and the anode/body well 120. The anode/body well 120 may be electrically connected to a first electrode at the front side.

The doped electrode/emitter layer 139 forms an ohmic contact with a second electrode directly adjoining the second surface 102 on the back.

The doped main structure 130 may include a lightly doped drift zone, a superjunction structure, a field stop or buffer layer between the lightly doped drift zone and the doped electrode/emitter layer 139 as well as counter-doped regions, e.g., CIBH (controlled injection of backside holes structures.

A lateral structure 108 directly adjoins the lateral surface 103 and the main structure 130. The lateral structure 108 includes at least one impurity, which is not contained in the main structure 130 at the same distance y to the first surface 101 or which concentration in the main structure 130 at the same distance y to the first surface 101 is, e.g., at least one or two orders of magnitude lower than a maximum in the lateral structure 108.

Within at least a portion of the lateral structure 108, a concentration of the at least one impurity steadily decreases with increasing distance x from the lateral surface 103. The lateral structure 108 surrounds the main structure 130 in the horizontal directions. Surfaces of equal concentration of the at least one impurity extend at equal distance to the lateral surface 103 as illustrated in FIG. 16A.

The concentration of the at least one impurity may steadily decrease in the complete lateral structure 108. For example, the lateral concentration profile of the concerned impurity equals a sigmoid function, e.g., approximates the complementary error function erfc(x), in case the impurities are indiffused from the sidewalls. In case the impurities are implanted through the sidewalls, the lateral concentration profile of the concerned impurity may approximate a Gaussian distribution.

In FIG. 16B a distance x1 between the lateral surface 103 and a surface of equal impurity concentration slightly increases with increasing distance y to the first surface 101, wherein a slope Δx1/Δy depends on the diffusion properties of the impurity and the process parameters of the epitaxy process. For example, at or close to the second surface 102 a distance of a surface of equal impurity concentration to the lateral surface 103 may be at most 20 µm, e.g., at most 10 µm greater than at or close to the first surface 101.

The impurities defining the lateral structure 108 may be non-doping impurities such as carbon, oxygen, nitrogen and/or heavy metal atoms and/or dopants such as boron, phosphorus, arsenic, selenium and/or sulfur. The lateral surface 103 may be completely vertical from the first surface 101 to the second surface 102.

Figure 17A:
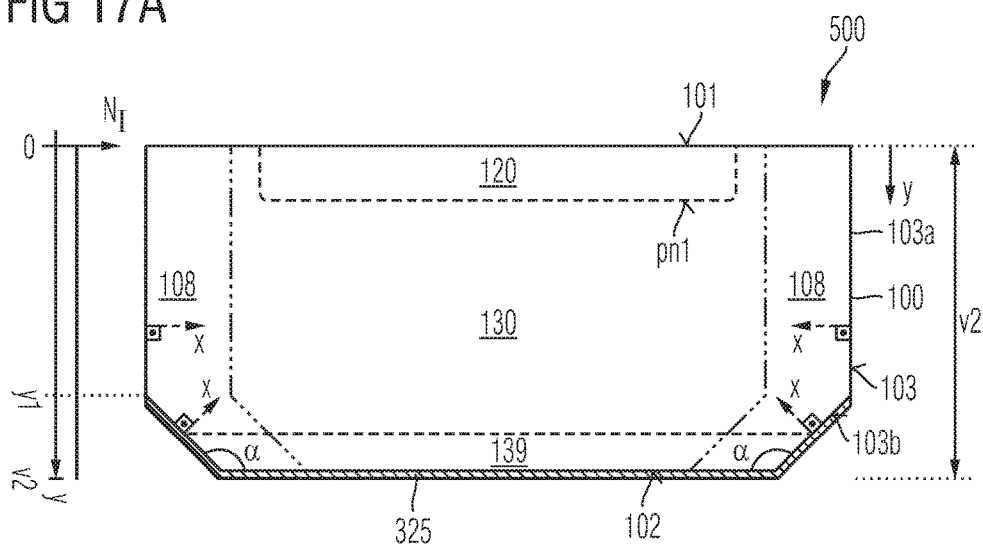
FIG. 17A is a schematic vertical cross-sectional view of a semiconductor device with a lateral structure of uniform width according to an embodiment concerning a semiconductor body chamfered at a rear side.
Figure 17B:
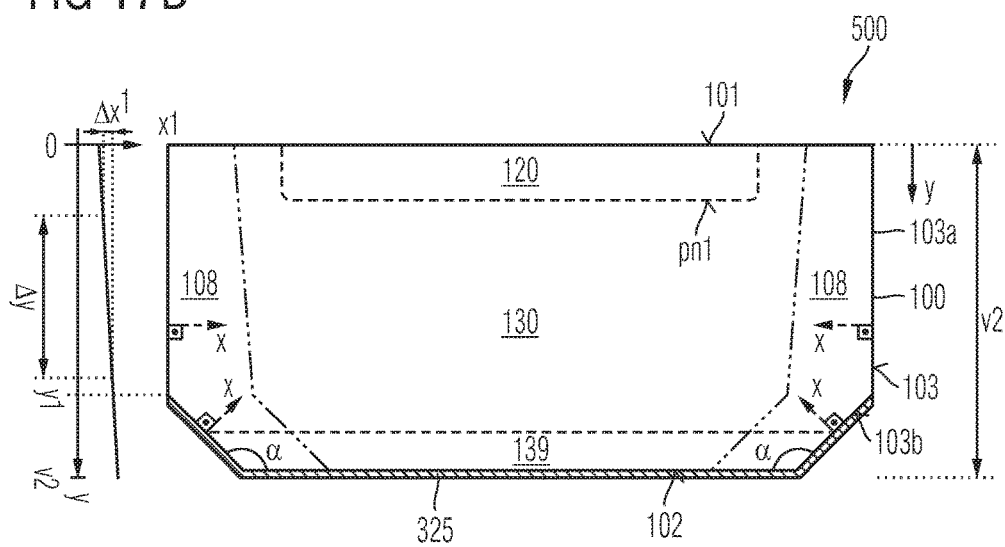
FIG. 17B is a schematic vertical cross-sectional view of a semiconductor device with a lateral structure with a width increasing with increasing distance to the first surface according to another embodiment concerning a semiconductor body chamfered at a rear side.

The embodiment in FIGS. 17A and 17B is based on an anisotropic wet etching that forms epitaxy troughs aligned in a <010> crystal direction. The wet etching may form a lateral surface 103 with a first section 103a formed, e.g., from a {100} crystal plane and directly adjoining the first surface 101, and a second section 103b formed from {110} planes and directly adjoining the second surface 102.

A slope angle α between the second surface 102 and the second section 103b of the lateral surface 103 may be about 135°. The first section 103a may extend across at least 50%, e.g., at least 80% or at least 90%, e.g., 100% of the total vertical extension v2 of the semiconductor body 100. In both the first section 103a and the second section 103b a distance between the lateral surface 103 and the surface of equal concentration of the impurity is measured perpendicular to the lateral surface 103 such that the surfaces of uniform dopant concentration bend at a vertical distance y1 to the first surface 101 defined by the edge between the first section 103a and the second section 103b of the lateral surface 103.

A metal layer 325 may cover the second surface 102 and at least a portion of the second section 103b of the lateral surface 103. In case the semiconductor device 500 is soldered with the rear side down onto a chip carrier, excess solder can accumulate in a free space between the chip carrier and the second section 103b of the lateral surface 103 and does not coat the first section 103a of the lateral 103, which other than the second section 103b is not coated by a metallic layer or layer stack. FIGS. 18A and 18B illustrate semiconductor devices with a higher concentration of non-doping impurities such as oxygen, nitrogen, carbon and/or heavy metal atoms in a lateral structure 108 on the basis of an embodiment referring to a semiconductor diode 501.

The anode/body well 120 forms a p-type anode and the main structure 130 forms the n-type cathode. The anode/body well 120 forms an ohmic contact with a first electrode structure 310 directly adjoining the first surface 101, wherein the first electrode structure 310 may be or may be electrically connected or coupled to an anode terminal A. The doped electrode/emitter layer 139 directly adjoins to and forms an ohmic contact with a second electrode structure 320 that forms or that is electrically connected or coupled to a cathode terminal K.

The main structure 130 may further include a lightly doped n-type drift zone 131 forming the first pn junction pn1 with the anode/body well 120. A horizontal field stop layer 138 may be sandwiched between the drift zone 131 and the doped electrode/emitter layer 139, wherein a mean dopant concentration in the horizontal field stop layer 138 is at least three times or at least five times as high as a mean dopant concentration in the drift zone 131 and wherein a maximum dopant concentration in the doped electrode/emitter layer 139 is at least one order of magnitude higher than in the horizontal field stop layer 138.

For the description of the lateral structure 108 reference is made to the description of FIGS. 16A to 16B. In the lateral structure 108 a maximum dopant concentration of oxygen, nitrogen and/or carbon is at least one, e.g., two orders of magnitude higher than in portions of the semiconductor body 100 outside of the lateral structure 108. The additional impurities may locally harden the crystal lattice of the semiconductor body 100. The hardened lateral structure 108 is less prone to defects induced, e.g., by stress induced by annealing steps or by a separation process separating the semiconductor body 100 from a semiconductor substrate, wherein the separation process may include a mechanical process such as sawing, by way of example. For example, the penetration of slip lines can be significantly hindered by the incorporation of oxygen or nitrogen atoms in the lateral structure 108. The lateral structure 108 may be formed by diffusion from a matrix material containing the impurities such as oxygen, nitrogen and/or carbon or may include a portion of the matrix material.

The lateral structures 108 as illustrated in FIGS. 18A and 18B may be formed also in the semiconductor bodies of IGFETs, IGBTs, MOSFETs and thyristors, by way of example.

Figure 19A:
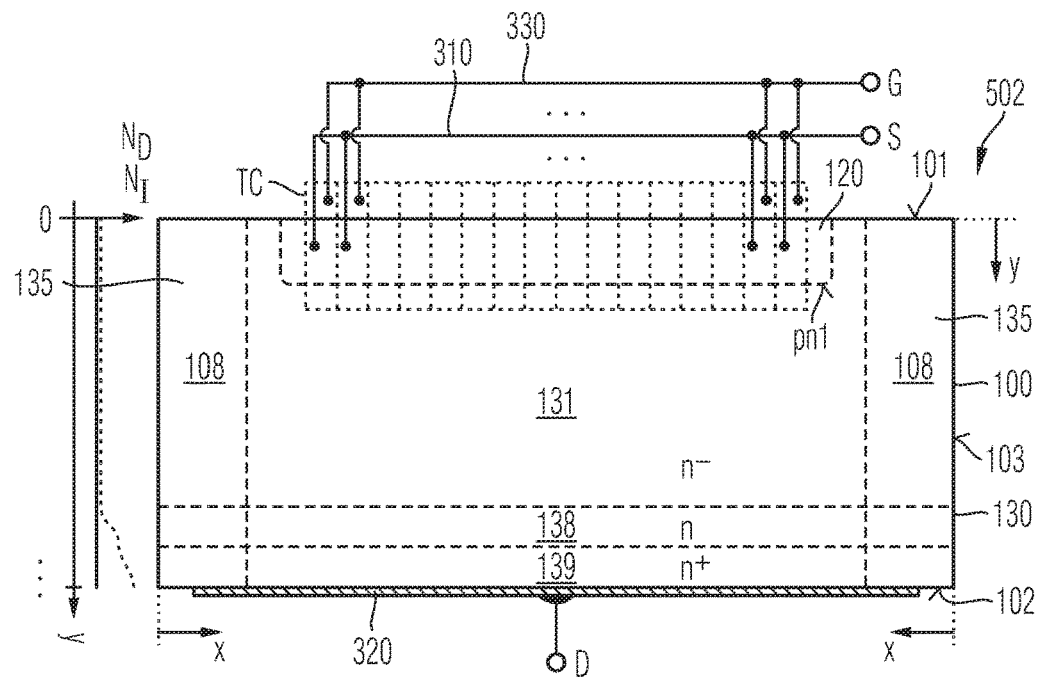
FIG. 19A is a schematic vertical cross-sectional view of an IGFET according to an embodiment with a lateral structure of uniform width and containing dopants.
Figure 19B:
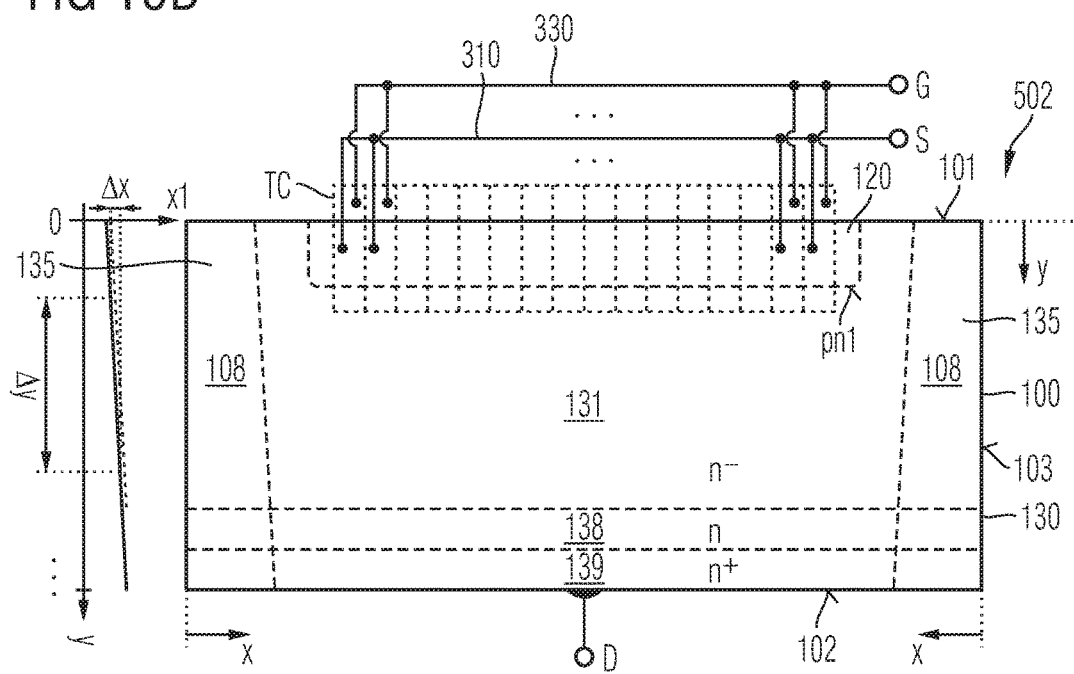
FIG. 19B is a schematic vertical cross-sectional view of an IGFET according to another embodiment with a lateral structure with a width increasing with increasing distance to the front side and containing dopants.

FIGS. 19A and 19B illustrate semiconductor devices with lateral structures 108 forming doped regions extending along the lateral surface 103 on the basis of an embodiment concerning IGFETs 502.

The IGFETs 502 include transistor cells TC at the front side, wherein the anode/body well 120 forms the body zones of the transistor cells TC. The body zones form second pn junctions with source zones formed between the first surface 101 and the anode/body well 120 and separate the source zones from the main structure 130. The transistor cells TC may be planar transistor cells with controllable channels formed parallel to the first surface 101 and with gate electrodes formed on the first surface 101 or vertical transistor cells with a controllable channel extending vertical to the first surface 101 and with trench gate structures extending from the first surface 101 into the semiconductor body 100. The semiconductor body 100 may further include compensation structures such as field electrodes extending into a drift zone 131 in the main structure 130.

The anode/body well 120 as well as the source zones of the transistor cells TC are electrically connected to a first electrode structure 310 which may form or which may be electrically coupled to a source terminal S. Gate electrodes of the transistor cells TC are electrically connected to a control electrode structure 330 that forms or that may be electrically connected or coupled to a gate terminal G. The second electrode structure 320 on the back may form or may be electrically connected to a drain terminal D.

The lateral structure 108 extends from the first surface 101 to the second surface 102. The lateral structure 108 is defined by type and/or concentration of a first dopant, e.g., phosphorus or arsenic atoms. The lateral structure 108 superposes the drift zone 131, the field stop layer 138 and the doped electrode/emitter layer 139, which may exclusively contain second dopants different from the first dopant, or which also may contain the first dopant, wherein the superposition results in that the dopant concentration of the lateral structure 108 adds up to the dopant concentration in the drift zone 131, the field stop layer 138 and the electrode/emitter layer 139.

In each case, in the lateral structure 108 a concentration of the first dopants decreases with increasing distance to the lateral surface 103.

In case the first dopant is not contained in the main structure 130, a distance between the lateral surface 103 and a surface of equal concentration of the first dopant is uniform as illustrated in FIG. 19A or increases with increasing distance to the first surface 101 by not more than 20 µm, e.g., at most 10 µm.

In case the main structure 130 does include the first dopants, in the lateral structure 108 the distance between the lateral surface 103 and a surface of equal excess concentration of the first dopants in the lateral structure 108 with respect to a reference concentration of the first dopants in a portion of the main structure 130 in the center of the semiconductor body 100 at the same distance y to the first surface 101 is uniform or increases with increasing distance to the first surface 101.

The doped lateral structure 108 connects the electrode/emitter layer 139 with a structure at the first surface 101 such that the lateral surface 103 is free of electric fields. A field electrode may be formed at the front side above the lateral structure 108. The lateral structure 108 may form a vertical field stop 135 or lateral channel stopper.

Figure 20A:
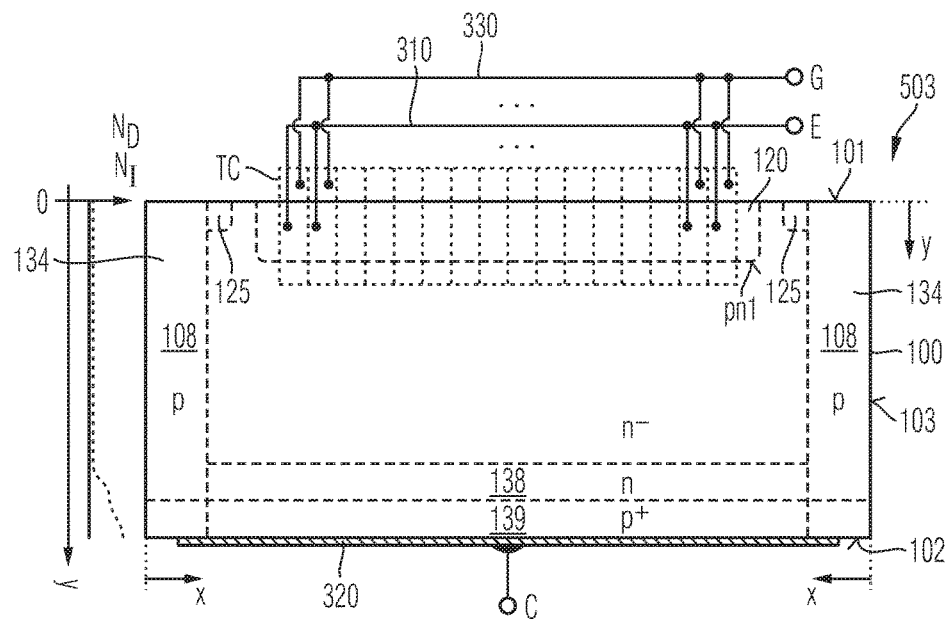
FIG. 20A is a schematic vertical cross-sectional view of an IGBT according to an embodiment with a lateral structure of uniform width and containing dopants.
Figure 20B:
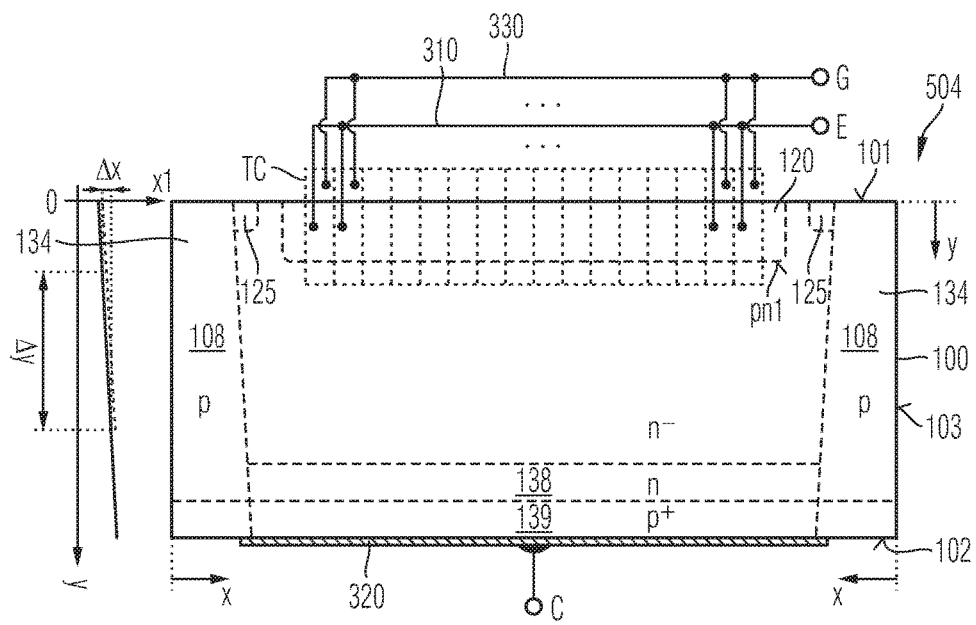
FIG. 20B is a schematic vertical cross-sectional view of an IGBT according to another embodiment with a lateral structure with a width increasing with increasing distance to the front side and containing dopants.

FIGS. 20A to 20B illustrate the formation of a p-type lateral structure 108 forming vertical p-type regions 134 on the basis of an IGBT 503.

Other than in the embodiment of FIGS. 19A and 19B the first electrode structure 310 forms or is electrically connected to an emitter terminal E. The doped electrode/emitter layer 139 is p-type and the second electrode structure 320 electrically connects the doped electrode/emitter layer 139 with a collector terminal C. The lateral structure 108 includes acceptor atoms such as boron and forms a circumferential vertical p-type region 134 connecting a doped edge region 129 extending from the first surface 101 into the semiconductor body 100 with the p-type electrode/emitter layer 139. As regards details of the lateral structures 108 reference is made to the description of FIGS. 19A to 19B.

FIGS. 21A and 21B show thyristors 504 with lateral structures 108 as described above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor devices, the method comprising:
    forming epitaxy troughs in a semiconductor substrate, wherein a matrix section of the semiconductor substrate laterally separates the epitaxy troughs and comprises a first semiconductor material;
    forming crystalline epitaxy regions of a second semiconductor material in the epitaxy troughs, wherein the second semiconductor material differs from the first semiconductor material in at least one of porosity, impurity content or defect density; and
    forming, from the epitaxy regions, at least main body portions of semiconductor bodies of the semiconductor devices.

2. The method of claim 1, wherein the first and second semiconductor materials have a same main constituent or same main constituents.

3. The method of claim 2, wherein the same main constituent is silicon or the same main constituents is silicon carbide.

4. The method of claim 1, wherein
    forming at least the main body portions comprises forming, in each main body portion, an anode/body well forming a first pn junction with a main structure in the semiconductor body.

5. The method of claim 1, wherein forming at least the main body portions comprises forming, in each main body portion, a plurality of transistor cells electrically arranged in series.

6. The method of claim 1, further comprising diffusing impurities from the matrix section into the epitaxy regions.

7. The method of claim 6, wherein the impurities comprise non-doping impurities.

8. The method of claim 6, wherein the impurities comprise oxygen atoms.

9. The method of claim 6, wherein the impurities comprise dopants.

10. The method of claim 1, wherein a conductivity type of the epitaxy region is complementary to a conductivity type of the matrix section.

11. The method of claim 1, further comprising pretreating at least rip sidewall sections of the matrix section to form the first semiconductor material.

12. The method of claim 1, further comprising forming, after forming the epitaxy troughs, a horizontal porous layer in the semiconductor substrate.

13. The method of claim 1, further comprising increasing, by at least 10%, porosity in at least rip sidewall sections of the matrix section to form the first semiconductor material.

14. The method of claim 13, further comprising separating the semiconductor bodies from the semiconductor substrate by removing at least the porous rip sidewall sections of the matrix section.

15. The method of claim 1, further comprising separating the semiconductor bodies from the semiconductor substrate along dicing streets running in ribs of the matrix section.

16. The method of claim 1, wherein the semiconductor bodies comprise lateral body portions formed from the first semiconductor material, wherein the lateral body portions surround the main body portions.

17. The method of claim 1, wherein the semiconductor bodies comprise base portions from the semiconductor substrate.

18. The method of claim 1, wherein the semiconductor bodies are formed from the epitaxy regions.

* * * * *